United States Patent
Van Adrichem et al.

(10) Patent No.: US 11,422,472 B2
(45) Date of Patent: Aug. 23, 2022

(54) PATTERNING PROCESS IMPROVEMENT INVOLVING OPTICAL ABERRATION

(71) Applicant: ASML NETHERLANDS B.V., Veldhoven (NL)

(72) Inventors: Paulus Jacobus Maria Van Adrichem, Wijchen (NL); Ahmad Wasiem Ibrahim El-Said, San Jose, CA (US); Christoph Rene Konrad Cebulla Hennerkes, Felton, CA (US); Johannes Christiaan Maria Jasper, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/769,534

(22) PCT Filed: Dec. 17, 2018

(86) PCT No.: PCT/EP2018/085166
§ 371 (c)(1),
(2) Date: Jun. 3, 2020

(87) PCT Pub. No.: WO2019/121491
PCT Pub. Date: Jun. 27, 2019

(65) Prior Publication Data
US 2021/0165332 A1 Jun. 3, 2021

Related U.S. Application Data

(60) Provisional application No. 62/609,802, filed on Dec. 22, 2017.

(51) Int. Cl.
*G03F 7/20* (2006.01)

(52) U.S. Cl.
CPC .......... *G03F 7/70441* (2013.01); *G03F 7/706* (2013.01); *G03F 7/70433* (2013.01)

(58) Field of Classification Search
CPC ... G03F 7/70433; G03F 7/70441; G03F 7/706
See application file for complete search history.

(56) References Cited

U.S. PATENT DOCUMENTS 4,135,930 A * 1/1979 Hosokoshi ............ H01J 9/2273
396/546
4,604,654 A * 8/1986 Sakurada ............... B41J 2/2125
347/15

(Continued)

FOREIGN PATENT DOCUMENTS

| CN | 101373338 | 2/2009 |
| CN | 102841509 | 12/2012 |

(Continued)

OTHER PUBLICATIONS

Kahng et al.; "Lens Aberration Aware Timing-Driven Placement"; Proceedings of the Design Automation & Test in Europe Conference; vol. 1 | Conference Paper | Publisher: IEEE (Year: 2006).*

(Continued)

*Primary Examiner* — Helen Rossoshek
(74) *Attorney, Agent, or Firm* — Pillsbury Winthrop Shaw Pittman LLP

(57) ABSTRACT

A method involving: obtaining a process model of a patterning process that includes or accounts for an average optical aberration of optical systems of a plurality of apparatuses for use with a patterning process; and applying the process model to determine an adjustment to a parameter of the patterning process to account for the average optical aberration.

20 Claims, 17 Drawing Sheets

(56) References Cited

U.S. PATENT DOCUMENTS

| | | | | |
|---|---|---|---|---|
| 5,525,810 | A * | 6/1996 | Jewell | G06K 7/10574 235/462.06 |
| 6,522,386 | B1 * | 2/2003 | Nishi | G03F 7/70241 355/52 |
| 7,003,758 | B2 | 2/2006 | Ye et al. | |
| 7,083,290 | B2 * | 8/2006 | Masaki | G02B 5/0891 353/122 |
| 7,181,707 | B2 * | 2/2007 | Kotani | H01L 22/20 257/E21.525 |
| 7,266,800 | B2 * | 9/2007 | Sezginer | G03F 7/70425 716/52 |
| 7,353,493 | B2 * | 4/2008 | Akiyama | G03F 1/36 716/53 |
| 7,587,704 | B2 | 9/2009 | Ye et al. | |
| 8,121,387 | B2 * | 2/2012 | Asano | G06T 7/001 382/141 |
| 8,200,468 | B2 | 6/2012 | Ye et al. | |
| 8,690,323 | B2 * | 4/2014 | Hatanaka | G02C 7/028 351/159.75 |
| 9,086,388 | B2 * | 7/2015 | Ogawa | G01N 21/956 |
| 9,557,277 | B2 * | 1/2017 | Inoue | G01N 21/956 |
| 9,707,641 | B2 * | 7/2017 | McCollum | B23K 26/361 |
| 9,995,923 | B2 * | 6/2018 | Watanabe | G02F 1/0121 |
| 10,599,048 | B2 * | 3/2020 | Tarabrin | G03F 9/7023 |
| 2002/0171815 | A1 * | 11/2002 | Matsuyama | G03F 7/70308 355/55 |
| 2006/0152677 | A1 * | 7/2006 | Youssefi | G01J 9/00 351/205 |
| 2006/0158611 | A1 * | 7/2006 | Piers | A61B 3/1015 351/159.74 |
| 2007/0031745 | A1 | 2/2007 | Ye et al. | |
| 2007/0050749 | A1 | 3/2007 | Ye et al. | |
| 2007/0130560 | A1 | 6/2007 | Kotani et al. | |
| 2007/0247610 | A1 | 10/2007 | Shi et al. | |
| 2008/0301620 | A1 | 12/2008 | Ye et al. | |
| 2008/0309897 | A1 | 12/2008 | Wong et al. | |
| 2009/0053628 | A1 | 2/2009 | Ye et al. | |
| 2009/0231568 | A1 * | 9/2009 | Fukuhara | G03F 7/7085 355/67 |
| 2010/0162197 | A1 | 6/2010 | Ye et al. | |
| 2010/0180251 | A1 | 7/2010 | Ye et al. | |
| 2010/0315614 | A1 | 12/2010 | Hansen | |
| 2011/0099526 | A1 | 4/2011 | Liu | |
| 2012/0038753 | A1 * | 2/2012 | Hoshino | H04N 5/232123 348/51 |
| 2012/0254813 | A1 | 10/2012 | Chen et al. | |
| 2012/0261474 | A1 * | 10/2012 | Kawashime | G02B 7/32 235/462.24 |
| 2017/0038692 | A1 | 2/2017 | Hsu et al. | |
| 2017/0184979 | A1 | 6/2017 | Hsu et al. | |
| 2017/0255738 | A1 * | 9/2017 | Van Leest | G01N 21/9501 |
| 2017/0261863 | A1 * | 9/2017 | Downes | G03F 7/706 |
| 2018/0067900 | A1 | 3/2018 | Mos et al. | |
| 2018/0259858 | A1 * | 9/2018 | Chen | G03F 7/70558 |
| 2019/0369480 | A1 * | 12/2019 | Hansen | G06F 17/10 |
| 2020/0249576 | A1 * | 8/2020 | Warnaar | G03F 7/70633 |
| 2021/0080837 | A1 * | 3/2021 | Rijpstra | G03F 7/70525 |

FOREIGN PATENT DOCUMENTS

| | | |
|---|---|---|
| JP | 2002353104 | 12/2002 |
| KR | 20050121728 | 12/2005 |
| TW | 201740220 | 11/2017 |
| WO | 2010059954 | 5/2010 |
| WO | 2018153711 | 8/2018 |
| WO | 2018197146 | 11/2018 |

OTHER PUBLICATIONS

International Search Report and Written Opinion issue in corresponding PCT Patent Application No. PCT/EP2018/085166, dated Mar. 27, 2019.

Cao, Yu et al.: "Optimized hardware and software for fast full-chip simulation", Proc. of SPIE, vol. 5754, No. 405 (2005).

Rosenbluth, Alan E. et al.: "Optimum Mask and Source Patterns to Print a Given Shape," Journal of Microlithography, Microfabrication, Microsystems, MEMS and MOEMS (2002).

Socha, Robert et al.: "Simultaneous Source Mask Optimization (SMO)," Proc. of SPIE, vol. 5853 (2005).

Spence, C.: "Full-Chip Lithography Simulation and Design Analysis—How OPC is Changing IC Design," Proc. of SPIE, vol. 5751 (2005).

Korean Office Action issued in corresponding Korean Patent Application No. 10-2020-7017854, dated Jan. 18, 2021.

Chinese Office Action issued in corresponding Chinese Patent Application No.201880083208.0, dated May 25, 2022.

* cited by examiner

PATTERNING PROCESS IMPROVEMENT INVOLVING OPTICAL ABERRATION

CROSS-REFERENCE TO RELATED APPLICATIONS

This application is the U.S. national phase entry of PCT patent application no. PCT/EP2018/085166, which was filed on Dec. 17, 2018, which claims the benefit of priority of U.S. patent application No. 62/609,802 which was filed on Dec. 22, 2017, and which is incorporated herein in its entirety by reference.

FIELD

The description herein relates to patterning apparatuses and processes, and more particularly to a method or tool for optimization of an aspect of a patterning process, such as an illumination mode and/or patterning device pattern for use in a lithographic apparatus or process of the patterning process.

BACKGROUND

A lithography apparatus is a machine that applies a desired pattern onto a target portion of a substrate. A lithography apparatus can be used, for example, in the manufacture of devices such as integrated circuits (ICs). In that circumstance, a patterning device (e.g., a mask or a reticle) may be used to generate a pattern corresponding to an individual layer of the device, and this pattern can be transferred onto a target portion (e.g. comprising part of, one or several dies) on a substrate (e.g. a silicon wafer) that has, e.g., a layer of radiation-sensitive material (resist), by methods such as irradiating the target portion via a pattern on the patterning device. In general, a single substrate will contain a plurality of adjacent target portions to which the pattern is transferred successively by the lithographic apparatus, one target portion at a time. In one type of lithographic apparatus, the pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, a lithographic projection apparatus will have a demagnification factor M (generally >1), the speed F at which the substrate is moved will be a factor M times that at which the projection beam scans the patterning device.

Prior to transferring the pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

SUMMARY

Optical aberrations can play a role in the performance of a patterning process. Accordingly, there is provided herein technique to enable patterning process design, modification, control, etc. that accounts for optical aberrations.

In an embodiment, there is provided a method comprising: obtaining a process model of a patterning process that includes or accounts for an average optical aberration of optical systems of a plurality of apparatuses for use with a patterning process; and applying, by a hardware computer system, the process model to determine an adjustment to a parameter of the patterning process to account for the average optical aberration.

In an embodiment, there is provided a method comprising: obtaining an average optical aberration of optical systems of a plurality of apparatuses of a patterning process; and generating, by a hardware computer system, a process model that is configured to determine an adjustment to a parameter of the patterning process to account for the average optical aberration.

In an embodiment, there is provided a method comprising: obtaining optical aberrations of an optical system of each of a plurality of lithographic apparatuses for use in a patterning process, each optical aberration being obtained at a plurality of locations of an exposure field of the lithographic apparatuses; and computing, by a hardware computer system, an average optical aberration of the plurality of lithographic apparatuses at each of the plurality of locations of the exposure field.

In an embodiment, there is provided a method comprising: determining an average optical aberration of the optical systems of a plurality of apparatuses for use in a patterning process; and generating, by a hardware computer system, an optical proximity model for adjusting a pattern to be imaged onto a substrate using the patterning process, wherein the optical proximity model is configured to apply optical proximity corrections to the pattern to at least partially compensate for the determined average optical aberration.

In an embodiment, there is provided method of adjusting a pattern to be imaged onto a substrate using the patterning process, the method comprising applying a model as described herein.

In an embodiment, there is provided a computer program product comprising a non-transitory computer readable medium having instructions recorded thereon, the instructions when executed by a computer implementing a method as described herein.

BRIEF DESCRIPTION OF THE DRAWINGS

The above aspects and other aspects and features will become apparent to those ordinarily skilled in the art upon review of the following description of specific embodiments in conjunction with the accompanying figures, wherein.

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

DETAILED DESCRIPTION

Before describing embodiments in detail, it is instructive to present an example environment in which embodiments may be implemented.

Figure 1:
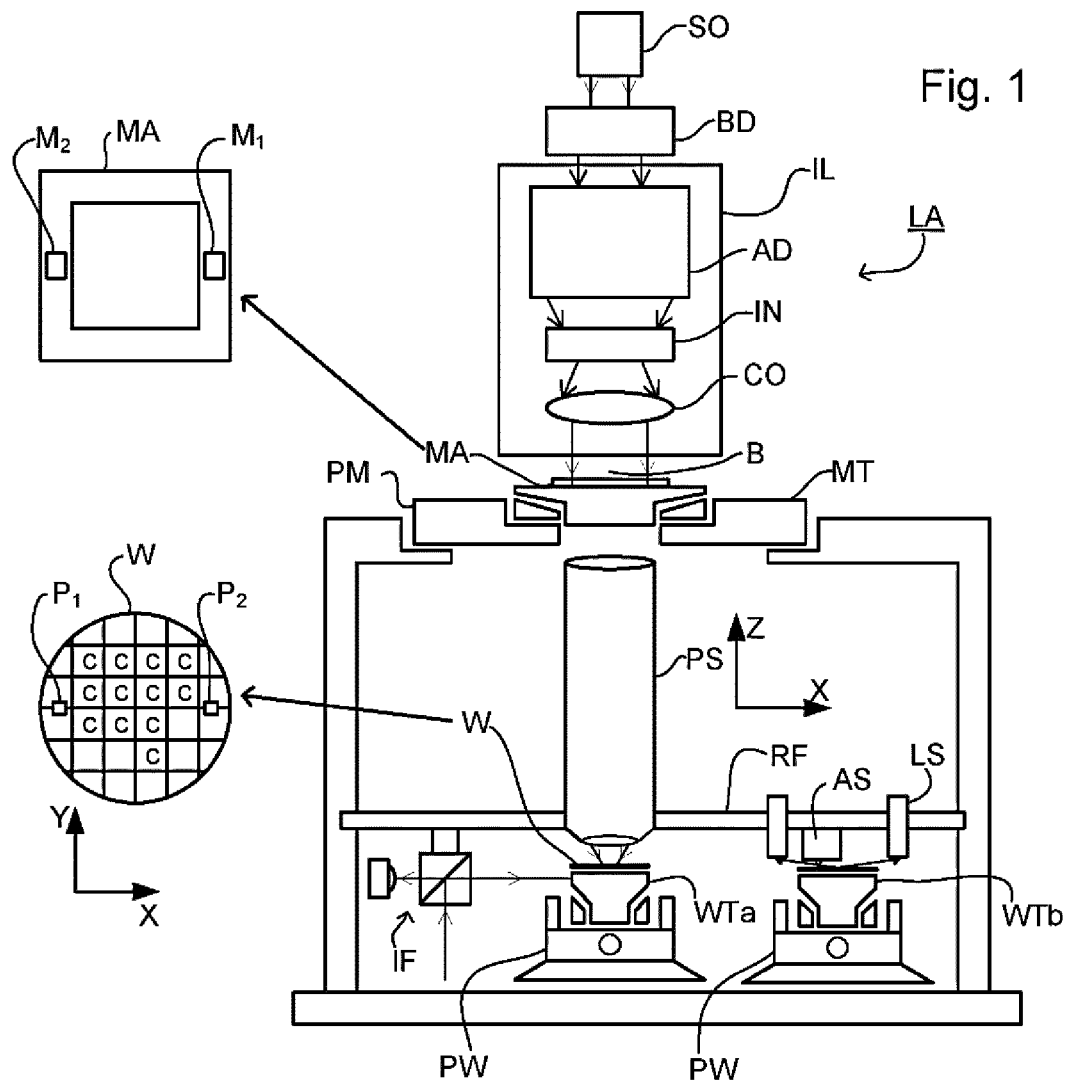
FIG. 1 schematically depicts a lithography apparatus according to an embodiment.

FIG. 1 schematically depicts an embodiment of a lithographic apparatus LA. The apparatus comprises:

an illumination system (illuminator) IL configured to condition a radiation beam B (e.g. extreme ultra violet (EUV) radiation or electromagnetic radiation such as UV radiation or DUV);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT (e.g., WTa, WTb or both) constructed to hold a substrate (e.g. a resist-coated wafer) W and connected to a second positioner PW configured to accurately position the substrate in accordance with certain parameters; and a projection system (e.g. a refractive, catoptric or catadioptric projection system) PS configured to project a pattern imparted to the radiation beam B by patterning device MA onto a target portion C (e.g. comprising one or more dies and often referred to as fields) of the substrate W, the projection system supported on a reference frame (RF).

As here depicted, the apparatus is of a transmissive type (e.g. employing a transmissive mask). Alternatively, the apparatus may be of a reflective type (e.g. employing a programmable mirror array or LCD matrix, or employing a reflective mask).

The illuminator IL receives a beam of radiation from a radiation source SO (e.g., a mercury lamp or excimer laser). The radiation source and the lithographic apparatus may be separate entities, for example when the radiation source is an excimer laser. In such cases, the radiation source is not considered to form part of the lithographic apparatus and the radiation beam is passed from the radiation source SO to the illuminator IL with the aid of a beam delivery system BD comprising for example suitable directing mirrors and/or a beam expander. In other cases the radiation source may be an integral part of the apparatus, for example when the radiation source is a mercury lamp. The radiation source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

So, the illuminator IL may comprise adjuster AM configured to adjust the (angular/spatial) intensity distribution of the beam. Generally, at least the outer and/or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable alter the polarization of the beam and may be operable to adjust the polarization using adjuster AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illumination system may include various types of optical components, such as refractive, reflective, magnetic, electromagnetic, electrostatic or other types of optical components, or any combination thereof, for directing, shaping, or controlling radiation.

Thus, the illuminator provides a conditioned beam of radiation B, having a desired uniformity and intensity distribution in its cross section.

The support structure MT supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism AM configured to adjust one or more of the optical elements so as to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

So, in operation of the lithographic apparatus, a radiation beam is conditioned and provided by the illumination system IL. The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
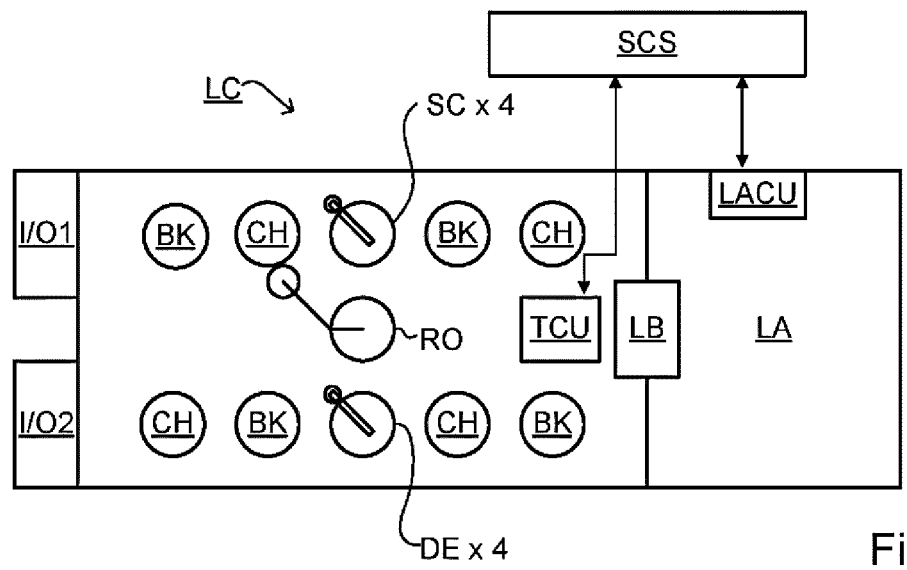
FIG. 2 schematically depicts an embodiment of a lithographic cell or cluster.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

As device manufacturing processes used to manufacture devices such as ICs continue to advance, the dimensions of functional elements have continually been reduced while the amount of functional elements, such as transistors, per device has been steadily increasing over decades, following a trend commonly referred to as "Moore's law". To enable this, some processes aim to create patterns at or below the classical resolution limit.

The process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (e.g., 193 nm or about 13 nm, e.g., about 13.5 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a device designer in order to achieve particular electrical functionality and performance. To overcome these difficulties, sophisticated fine-tuning steps are applied to the lithographic projection apparatus and/or patterning device pattern. These include, for example, but not limited to, optimization of optical coherence settings, customized illumination schemes, use of phase shifting patterning devices, optical proximity correction (OPC) in the patterning device pattern, optimization of NA, or other methods generally defined as "resolution enhancement techniques" (RET).

As an example, OPC addresses the fact that, in addition to any demagnification by the lithographic projection apparatus, the final size and placement of an image of the patterning device pattern projected on the substrate will not be identical to, or simply depend only on the size and placement of, the corresponding patterning device pattern features on the patterning device. It is noted that the terms "mask", "reticle", "patterning device" are utilized interchangeably herein. Also, person skilled in the art will recognize that, especially in the context of lithography simulation/optimization, the terms "mask pattern," "reticle pattern" and "patterning device pattern" can be used interchangeably, as in lithography simulation/optimization, a physical patterning device is not necessarily used but a patterning device pattern can be used to represent a physical patterning device. For the small feature sizes and high feature densities present on some patterning device patterns, the position of a particular edge of a given feature will be influenced to a certain extent by the presence or absence of other adjacent features. These proximity effects arise from minute amounts of radiation coupled from one feature to another and/or non-geometrical optical effects such as diffraction and interference. Similarly, proximity effects may arise from diffusion and other chemical effects during post-exposure bake (PEB), resist development, and etching that generally follow lithography.

In order to ensure that the projected image of the patterning device pattern is in accordance with requirements of a given target design, proximity effects should be predicted and compensated for, using sophisticated numerical models, corrections or pre-distortions of the patterning device pattern. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature of the patterning device pattern has some modification in order to achieve high fidelity of the projected image to the target design. These OPC modifications may include shifting or biasing of edge positions or line widths and/or application of "assist" features that are intended to assist projection of other features.

Application of model-based OPC to a target design involves good process models and considerable computational resources, given the many millions of features typically present in a device design. However, applying OPC is generally not an exact science, but an empirical, iterative process that does not always compensate for all possible proximity effects. Therefore, the effect of OPC, e.g., patterning device patterns after application of OPC and any other RET, should be verified by design inspection, e.g., intensive full-chip simulation using calibrated numerical process models, in order to reduce or minimize the possibility of design flaws being built into the patterning device pattern. This is driven by the enormous cost of making high-end patterning devices, which run in the multi-million dollar range, as well as by the impact on turn-around time by reworking or repairing actual patterning devices once they have been manufactured. Both OPC and full-chip RET verification may be based on numerical modelling systems and methods as described, for example in, U.S. Pat. No. 7,003,758 and an article titled "Optimized Hardware and Software For Fast, Full Chip Simulation", by Y. Cao et al., Proc. SPIE, Vol. 5754, 405 (2005), which are incorporated herein in their entireties by reference.

One of the simplest forms of OPC is selective bias. Given CD vs. pitch data, all of the different pitches could be forced to produce the same CD, at least at best focus and exposure, by changing the CD at the patterning device level. Thus, if a feature prints too small at the substrate level, the patterning device level feature would be biased to be slightly larger than nominal, and vice versa. Since the pattern transfer process from patterning device level to substrate level is non-linear, the amount of bias is not simply the measured CD error at best focus and exposure times the reduction ratio, but with modelling and experimentation an appropriate bias can be determined. Selective bias is an incomplete solution to the problem of proximity effects, particularly if it is only applied at the nominal process condition. Even though such bias could, in principle, be applied to give uniform CD vs. pitch curves at best focus and exposure, once the exposure process varies from the nominal condition, each biased pitch curve will respond differently, resulting in different process windows for the different features. A process window being a range of values of two or more process parameters (e.g., focus and radiation dose in the lithographic apparatus) under which a feature is sufficiently properly created (e.g., the CD of the feature is within a certain range such as ±10% or ±5%). Therefore, the "best" bias to give identical CD vs. pitch may even have a negative impact on the overall process window, reducing rather than enlarging the focus and exposure range within which all of the target features print on the substrate within the desired process tolerance.

Other more complex OPC techniques have been developed for application beyond the one-dimensional bias example above. A two-dimensional proximity effect is line end shortening. Line ends have a tendency to "pull back" from their desired end point location as a function of exposure and focus. In many cases, the degree of end shortening of a long line end can be several times larger than the corresponding line narrowing. This type of line end pull back can result in catastrophic failure of the devices being manufactured if the line end fails to completely cross over the underlying layer it was intended to cover, such as a polysilicon gate layer over a source-drain region. Since this type of pattern is highly sensitive to focus and exposure, simply biasing the line end to be longer than the design length is inadequate because the line at best focus and exposure, or in an underexposed condition, would be excessively long, resulting either in short circuits as the extended line end touches neighboring structures, or unnecessarily large circuit sizes if more space is added between individual features in the circuit. Since one of the goals of device design and manufacturing is often to maximize the number of functional elements while minimizing the area required per chip, adding excess spacing is an undesirable solution.

Two-dimensional OPC approaches may help solve the line end pull back problem. Extra structures (also known as "assist features") such as "hammerheads" or "serifs" may be added to line ends to effectively anchor them in place and provide reduced pull back over the entire process window. Even at best focus and exposure these extra structures are not resolved but they alter the appearance of the main feature without being fully resolved on their own. A "main feature" as used herein means a feature intended to print on a substrate under some or all conditions in the process window. Assist features can take on much more aggressive forms than simple hammerheads added to line ends, to the extent the pattern on the patterning device is no longer simply the desired substrate pattern upsized by the reduction ratio. Assist features such as serifs can be applied for many more situations than simply reducing line end pull back. Inner or outer serifs can be applied to any edge, especially two dimensional edges, to reduce corner rounding or edge extrusions. With enough selective biasing and assist features of all sizes and polarities, the features on the patterning device bear less and less of a resemblance to the final pattern desired at the substrate level. In general, the patterning device pattern becomes a pre-distorted version of the substrate-level pattern, where the distortion is intended to counteract or reverse the pattern deformation that will occur during the manufacturing process to produce a pattern on the substrate that is as close to the one intended by the designer as possible.

Another OPC technique involves using completely independent and non-resolvable assist features, instead of or in addition to those assist features (e.g., serifs) connected to the main features. The term "independent" here means that edges of these assist features are not connected to edges of the main features. These independent assist features are not intended or desired to print as features on the substrate, but rather are intended to modify the aerial image of a nearby main feature to enhance the printability and process tolerance of that main feature. These assist features (often referred to as "scattering bars" or "SBAR") can include sub-resolution assist features (SRAF) which are features outside edges of the main features and sub-resolution inverse features (SRIF) which are features scooped out from inside the edges of the main features. The presence of a SBAR adds yet another layer of complexity to a patterning device pattern. A simple example of a use of scattering bars is where a regular array of non-resolvable scattering bars is drawn on both sides of an isolated line feature, which has the effect of making the isolated line appear, from an aerial image standpoint, to be more representative of a single line within an array of dense lines, resulting in a process window much closer in focus and exposure tolerance to that of a dense pattern. The common process window between such a decorated isolated feature and a dense pattern will have a larger common tolerance to focus and exposure variations than that of a feature drawn as isolated at the patterning device level.

An assist feature may be viewed as a difference between features on a patterning device and features in the patterning device pattern. The terms "main feature" and "assist feature" do not imply that a particular feature on a patterning device must be labelled as one or the other.

In addition to, or alternatively to, optimization to patterning device patterns (e.g., OPC), an illumination mode can be optimized, either jointly with patterning device optimization or separately, in an effort to improve the overall lithography fidelity. Many off-axis illumination modes, such as annular, quadrupole, and dipole, have been used, and provide more freedom for OPC design, thereby improving the imaging results, As is known, off-axis illumination is a proven way to resolve fine structures (i.e., target features) contained in the patterning device. However, when compared to a traditional illumination mode, an off-axis illumination mode usually provides less radiation intensity for the aerial image (AI). Thus, it becomes desirable to attempt to optimize the illumination mode to achieve the optimal balance between finer resolution and reduced radiation intensity. Several illumination optimization approaches can be found, for example, in an article by Rosenbluth et al., titled "Optimum Mask and Source Patterns to Print a Given Shape", Journal of Microlithography, Microfabrication, Microsystems 1(1), pp. 13-20, (2002), which is incorporated herein in its entirety by reference.

The pressure of ever decreasing design rules drives semiconductor chipmakers to move deeper into low $k_1$ lithography. Lithography towards lower $k_1$ puts heavy demands on RET, exposure tools, and the need for litho-friendly design. So, to help ensure that the device design can be produced on to the substrate with workable process window, illumination mode—patterning device pattern optimization (referred to in some cases as source-mask optimization or SMO) is becoming a significant RET to achieve, e.g., smaller features.

So, for low $k_1$ photolithography, optimization of both the illumination mode and the patterning device pattern is useful to ensure a viable process window for projection of critical device patterns. Some algorithms (e.g. as described in Socha et al., "Simultaneous Source Mask Optimization (SMO)," Proc. SPIE Vol. 5853, 180-193 (2005), which is incorporated herein in its entirety by reference) discretize illumination into independent illumination distribution points and the patterning device pattern into diffraction orders in the spatial frequency domain, and separately formulate an objective function (which is defined as a function of selected design variables) based on process window metrics such as exposure latitude which could be predicted by optical imaging models from illumination distribution point intensities and patterning device pattern diffraction orders.

A further illumination mode and patterning device pattern optimization method and system that allows for simultaneous optimization of the illumination mode and the patterning device pattern using an objective function without constraints and within a practicable amount of time is described in PCT Patent Application Publication No. WO 2010/059954, titled "Fast Freeform Source and Mask Co-Optimization Method", which is hereby incorporated by reference in its entirety. Another illumination and patterning device optimization method and system that involves optimizing the illumination by adjusting pixels of the illumination distribution is described in U.S. Patent Application Publication No. 2010/0315614, titled "Source-Mask Optimization in Lithographic Apparatus", which is hereby incorporated by reference in its entirety.

Now, the patterning device referred to above can comprise one or more patterning device patterns. The patterning device pattern can be generated utilizing a CAD (computer-aided design) program, this process often being referred to as EDA (electronic design automation). Most CAD programs follow a set of predetermined design rules in order to create functional patterning device patterns for a patterning device. These rules are set by processing and design limitations. For example, design rules define the space tolerance between device features (such as gates, capacitors, etc.) or interconnect lines, so as to ensure that the devices or lines do not interact with one another in an undesirable way. The design rule limitation can be referred to as "critical dimensions" (CD). A critical dimension of a device can be defined as the smallest width of a line or hole or the smallest space between two lines or two holes. Thus, the CD determines the overall size and density of the designed device. One of the goals in device fabrication is to faithfully reproduce the original device design on the substrate (via the patterning device).

Further, in an optimization process of a system, a figure of merit of the system can be represented as an objective function (e.g., a cost function). The optimization process typically boils down to a process of finding a set of parameters (design variables) of the system that minimizes or maximizes the objective function. The objective function can have any suitable form depending on the goal of the optimization. For example, the objective function can be weighted root mean square (RMS) of deviations of certain characteristics (evaluation points) of the system with respect to the intended values (e.g., ideal values) of these characteristics; the objective function can also be the maximum of these deviations. The term "design variables" as used herein comprises a set of parameters of a patterning process (e.g., of a lithographic process, a lithographic projection apparatus, etc.), for example, parameters that a user of a lithographic projection apparatus can adjust. It should be appreciated that any characteristics of a patterning process, including those of the illumination mode, the patterning device pattern (or the patterning device construction), the projection optics, and/or resist characteristics can be among the design variables in the optimization. The objective function is often a non-linear function of the design variables. Then standard optimization techniques are used to, e.g., minimize or maximize the objective function. The term "evaluation points" herein should be interpreted broadly to include any characteristics of the system or process. The design variables of the system can be confined to finite ranges and/or be interdependent due to practicalities of implementations of the system or process. In case of a lithographic projection apparatus, the constraints are often associated with physical properties and characteristics of the hardware such as tunable ranges, and/or patterning device manufacturability design rules (MRCs), and the evaluation points can include physical points on a resist image on a substrate, as well as non-physical characteristics such as dose and focus.

So, in a lithographic projection apparatus, an illumination system provides illumination (i.e. radiation) to patterning device and projection optics directs the illumination from the patterning device onto a substrate. In an embodiment, the projection optics enables the formation of an aerial image (AI), which is the radiation intensity distribution on the substrate. A resist layer on the substrate is exposed and the aerial image is transferred to the resist layer as a latent "resist image" (RI) therein. The resist image (RI) can be defined as a spatial distribution of solubility of the resist in the resist layer. In an embodiment, simulation of a lithography process can simulate the production of the aerial image and/or resist image.

Figure 3:
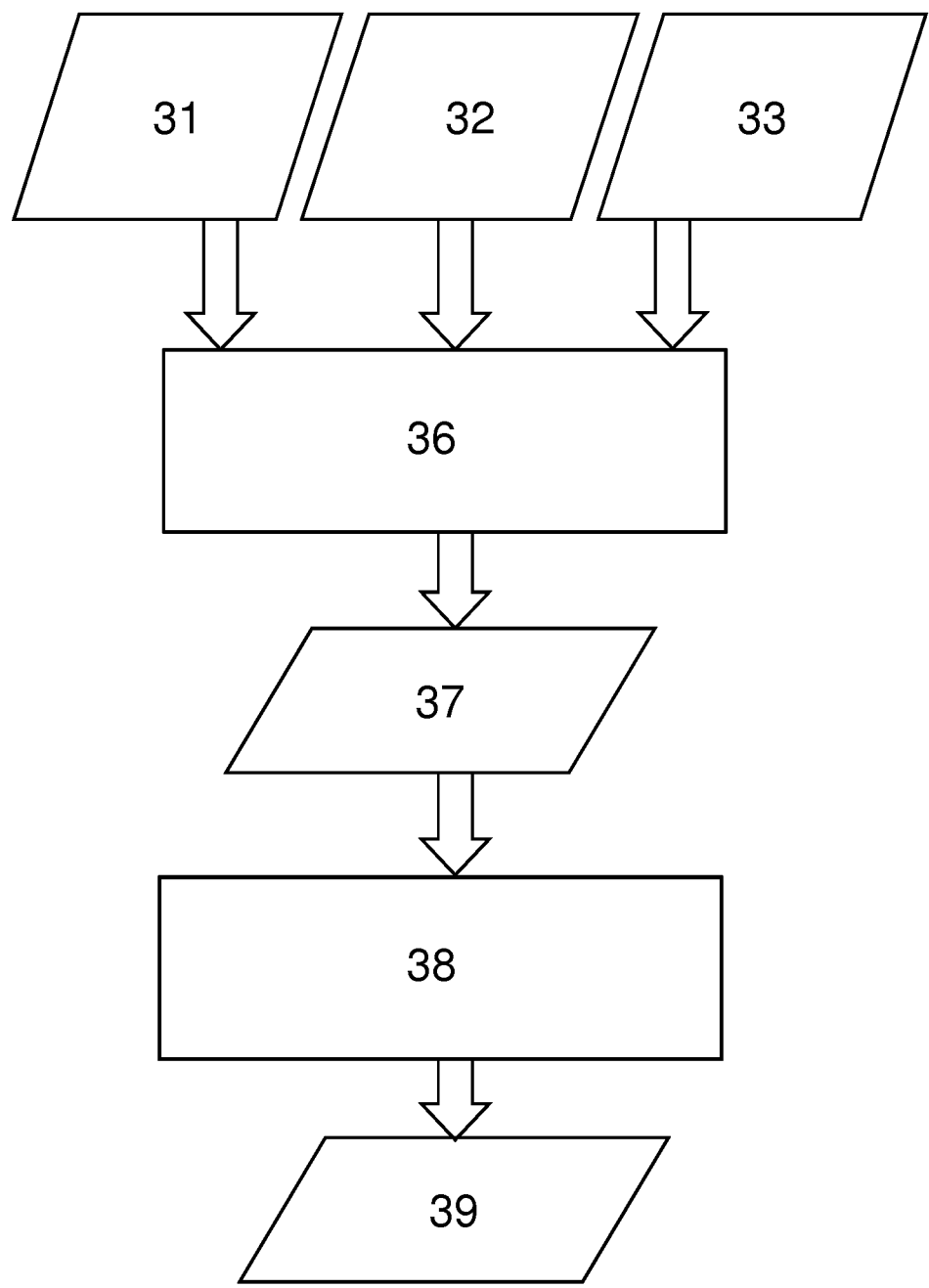
FIG. 3 is a block diagram of simulation models corresponding to the subsystems in FIG. 1.

An exemplary flow chart for modelling and/or simulating parts of a patterning process is illustrated in FIG. 3. As will be appreciated, the models may represent a different patterning process and need not comprise all the models described below.

An illumination model 31 represents optical characteristics (including radiation intensity distribution and/or phase distribution) of an illumination mode used to generate a patterned radiation beam. The illumination model 31 can represent the optical characteristics of the illumination that include, but not limited to, numerical aperture settings, illumination sigma ($\sigma$) settings as well as any particular illumination mode shape (e.g. off-axis radiation shape such as annular, quadrupole, dipole, etc.), where $\sigma$ (or sigma) is outer radial extent of the illuminator.

A projection optics model 32 represents optical characteristics (including changes to the radiation intensity distribution and/or the phase distribution caused by the projection optics) of the projection optics. The projection optics model 32 may include optical aberrations caused by various factors, for example, heating of the components of the projection optics, stress caused by mechanical connections of the components of the projection optics, etc. The projection optics model 32 can represent the optical characteristics of the projection optics, including one or more selected from: an aberration, a distortion, a refractive index, a physical size, a physical dimension, an absorption, etc. Optical properties of the lithographic projection apparatus (e.g., properties of the illumination, the patterning device pattern and the projection optics) dictate the aerial image. Since the patterning device pattern used in the lithographic projection apparatus can be changed, it is desirable to separate the optical properties of the patterning device pattern from the optical properties of the rest of the lithographic projection apparatus including at least the illumination and the projection optics. The illumination model 31 and the projection optics model 32 can be combined into a transmission cross coefficient (TCC) model.

A patterning device pattern model 33 represents optical characteristics (including changes to the radiation intensity distribution and/or the phase distribution caused by a given patterning device pattern) of a patterning device pattern (e.g., a device design layout corresponding to a feature of an integrated circuit, a memory, an electronic device, etc.), which is the representation of an arrangement of features on or formed by a patterning device. The patterning device model 33 captures how the design features are laid out in the pattern of the patterning device and may include a representation of detailed physical properties of the patterning device and a patterning device pattern, as described, for example, in U.S. Pat. No. 7,587,704, which is incorporated by reference in its entirety.

A resist model 37 can be used to calculate the resist image from the aerial image. An example of such a resist model can be found in U.S. Pat. No. 8,200,468, which is hereby incorporated by reference in its entirety. The resist model typically describes the effects of chemical processes which occur during resist exposure, post exposure bake (PEB) and development, in order to predict, for example, contours of resist features formed on the substrate and so it typically related only to such properties of the resist layer (e.g., effects of chemical processes which occur during exposure, post-exposure bake and development). In an embodiment, the optical properties of the resist layer, e.g., refractive index, film thickness, propagation and polarization effects—may be captured as part of the projection optics model 32.

Having these models, an aerial image 36 can be simulated from the illumination model 31, the projection optics model 32 and the patterning device pattern model 33. An aerial image (AI) is the radiation intensity distribution at substrate level. Optical properties of the lithographic projection apparatus (e.g., properties of the illumination, the patterning device and the projection optics) dictate the aerial image.

A resist layer on a substrate is exposed by the aerial image and the aerial image is transferred to the resist layer as a latent "resist image" (RI) therein. The resist image (RI) can be defined as a spatial distribution of solubility of the resist in the resist layer. A resist image 38 can be simulated from the aerial image 36 using a resist model 37. So, in general, the connection between the optical and the resist model is a simulated aerial image intensity within the resist layer, which arises from the projection of radiation onto the substrate, refraction at the resist interface and multiple reflections in the resist film stack. The radiation intensity distribution (aerial image intensity) is turned into a latent "resist image" by absorption of incident energy, which is further modified by diffusion processes and various loading effects. Efficient simulation methods that are fast enough for full-chip applications approximate the realistic 3-dimensional intensity distribution in the resist stack by a 2-dimensional aerial (and resist) image.

In an embodiment, the resist image can be used an input to a post-pattern transfer process model 39. The post-pattern transfer process model 39 defines performance of one or more post-resist development processes (e.g., etch, CMP, etc.) and can produce a post-etch image.

Thus, the model formulation describes most, if not all, of the known physics and chemistry of the overall process, and each of the model parameters desirably corresponds to a distinct physical or chemical effect. The model formulation thus sets an upper bound on how well the model can be used to simulate the overall manufacturing process.

Simulation of the patterning process can, for example, predict contours, CDs, edge placement (e.g., edge placement error), pattern shift, etc. in the aerial, resist and/or etched image. Thus, the objective of the simulation is to accurately predict, for example, edge placement, and/or contours, and/or pattern shift, and/or aerial image intensity slope, and/or CD, etc. of the printed pattern. These values can be compared against an intended design to, e.g., correct the patterning process, identify where a defect is predicted to occur, etc. The intended design is generally defined as a pre-OPC design layout which can be provided in a standardized digital file format such as GDSII or OASIS or other file format.

Details of techniques and models used to transform a patterning device pattern into various lithographic images (e.g., an aerial image, a resist image, etc.), apply OPC using those techniques and models and evaluate performance (e.g., in terms of process window) are described in U.S. Patent Application Publication Nos. US 2008-0301620, 2007-0050749, 2007-0031745, 2008-0309897, 2010-0162197, 2010-0180251 and 2011-0099526, the disclosure of each which is hereby incorporated by reference in its entirety.

To facilitate the speed of evaluating the models, from the patterning device pattern, one or more portions may be identified, which are referred to as "clips." In a specific embodiment, a set of clips is extracted, which represents the complicated patterns in the patterning device pattern (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is needed. In other words, clips may be the portions of the patterning device pattern or may be similar or have a similar behavior of portions of the patterning device pattern where critical features are identified either by experience (including clips provided by a customer), by trial and error, or by running a full-chip simulation. Clips usually contain one or more test patterns or gauge patterns. An initial larger set of clips may be provided a priori by a customer based on known critical feature areas in a patterning device pattern which require particular image optimization. Alternatively, in another embodiment, the initial larger set of clips may be extracted from the entire patterning device pattern by using some kind of automated (such as, machine vision) or manual algorithm that identifies the critical feature areas.

Furthermore, various patterns on or provided by a patterning device may have different process windows. i.e., a space of processing variables under which a pattern will be produced within specification. Examples of pattern specifications that relate to potential systematic defects include checks for necking, line pull back, line thinning, CD, edge placement, overlapping, resist top loss, resist undercut and/or bridging. The process window of all the patterns on a patterning device or an area thereof may be obtained by merging (e.g., overlapping) process windows of each individual pattern. The boundary of the process window of all the patterns contains boundaries of process windows of some of the individual patterns. In other words, these individual patterns limit the process window of all the patterns. These patterns can be referred to as "hot spots" or "process window limiting patterns (PWLPs)," which are used interchangeably herein. When designing, modifying, etc. a part of a patterning process using, for example, the modeling described herein, it is possible and economical to focus on the hot spots. When the hot spots are not defective, it is most likely that all the patterns are not defective.

Returning back the modeling of the patterning process, an optimization can be performed using, for example, an objective function, such as $$CF(z_1, z_2, \ldots, z_N) = \sum_{p=1}^{P} w_p f_p^2(z_1, z_2, \ldots, z_N) \quad (1)$$

wherein $(z_1, z_2, \ldots, z_N)$ are N design variables or values thereof; $f_p(z_1, z_2, \ldots, z_N)$ may be a function of a difference between an actual value and an intended value of a characteristic at the p-th evaluation point for a set of values of the design variables of $(z_1, z_2, \ldots, z_N)$. $w_p$ is a weight constant assigned to the p-th evaluation point. An evaluation point or pattern more critical than others can be assigned a higher $w_p$ value. Patterns and/or evaluation points with larger number of occurrences may be assigned a higher $w_p$ value, too. Examples of the evaluation points can be any physical point or pattern on the substrate, or any point on a patterning device pattern, or resist image, or aerial image.

The objective function may represent any suitable characteristics of the patterning process, such as of the lithographic projection apparatus or the substrate, for instance, focus, CD, image shift, image distortion, image rotation, etc. For example, the objective function may be a function of one or more of the following lithographic metrics: edge placement error, critical dimension, resist contour distance, worst defect size, pattern shift, stochastic effect, three-dimensional effect of the patterning device, three-dimensional effect of the resist, best focus shift, pupil fill factor, exposure time, and/or throughput. Since it is the resist image that often dictates the pattern on a substrate, the objective function often includes functions that represent some characteristics of the resist image. For example, $f_p(z_1, z_2, \ldots, z_N)$ of such an evaluation point can be simply a distance between a point in the resist image to an intended position of that point (i.e., edge placement error $EPE_p(z_1, z_2, \ldots, z_N)$). The design variables can be any adjustable parameters such as adjustable parameters of the illumination mode, the patterning device pattern, the projection optics, dose, focus, etc.

The lithographic apparatus may include one or more components collectively called a "wavefront manipulator" that can be used to adjust shapes of a wavefront and intensity distribution and/or phase shift of the radiation beam. The wavefront and intensity distribution can be adjusted at any location along an optical path of the lithographic projection apparatus, such as before the patterning device, near a pupil plane, near an image plane, or near a focal plane. The projection optics can be used to correct or compensate for certain distortions of the wavefront and intensity distribution caused by, for example, the illumination, the patterning device, temperature variation in the lithographic projection apparatus, and/or thermal expansion of components of the lithographic projection apparatus. Adjusting the wavefront and intensity distribution can change values of the evaluation points and the objective function. Such changes can be simulated from a model or actually measured.

It should be noted that the normal weighted root mean square (RMS) of $f_p(z_1, z_2, \ldots, z_N)$ is defined as $\sqrt{1/P\sum_{p=1}^{P} w_p f_p^2(z_1,z_2,\ldots,z_N)}$, therefore, for example, minimizing the weighted RMS of $f_p(z_1, z_2, \ldots, z_N)$ is equivalent to minimizing the objective function $CF(z_1, z_2, \ldots, z_N) = \sum_{p=1}^{P} w_p f_p^2(z_1, z_2, \ldots, z_N)$, defined in Eq. 1. Thus the weighted RMS of $f_p(z_1, z_2, \ldots, z_N)$ and Eq. 1 may be utilized interchangeably for notational simplicity herein.

Further, if the process window (PW) is maximized, it is possible to consider the same physical location from different PW conditions as different evaluation points in the objective function in Eq. 1. For example, if N PW conditions are considered, then the evaluation points can be categorized according to their PW conditions and the objective functions can be written as:

$$CF(z_1, z_2, \ldots, z_N) = \sum_{p=1}^{P} w_p f_p^2(z_1, z_2, \ldots, z_N) = \sum_{u=1}^{U} \sum_{p_u=1}^{P_u} w_{p_u} f_{p_u}^2(z_1, z_2, \ldots, z_N) \quad (2)$$

where $f_{p_u}(z_1, z_2, \ldots, z_N)$ is a function of the difference between an actual value and an intended value of the $p_t$-th evaluation point for a set of values of the design variables of $(z_1, z_2, \ldots, z_N)$ under the u-th PW condition $u=1, \ldots, U$. When this difference is the edge placement error (EPE), then minimizing the above objective function is equivalent to minimizing the edge shift under various PW conditions, thus this leads to maximizing the PW. In particular, if the PW also includes different patterning device bias, then minimizing the above objective function also includes the minimization of mask error enhancement factor (MEEF), which is defined as the ratio between the substrate EPE and the induced patterning device pattern feature edge bias.

The design variables may have constraints, which can be expressed as $(z_1, z_2, \ldots, z_N) \in Z$, where $Z$ is a set of possible values of the design variables. The constraints may represent, e.g., physical restrictions in a hardware implementation of the lithographic projection apparatus. The constraints may include one or more selected from: a tuning range, a rules governing patterning device manufacturability (MRC), and/or interdependence between two or more design variables.

The optimization process therefore is to find a set of values of the design variables, under the constraints $(z_1, z_2, \ldots, z_N) \in Z$, that, e.g., minimize the objective function, i.e., to find $$(\tilde{z}_1, \tilde{z}_2, \ldots, \tilde{z}_N) = \arg\min_{(z_1, z_2, \ldots, z_N) \in Z} CF(z_1, z_2, \ldots, z_N) = \arg\min_{(z_1, z_2, \ldots, z_N) \in Z} \sum_{p=1}^{P} w_p f_p^2(z_1, z_2, \ldots, z_N)$$ (3)

Figure 4:
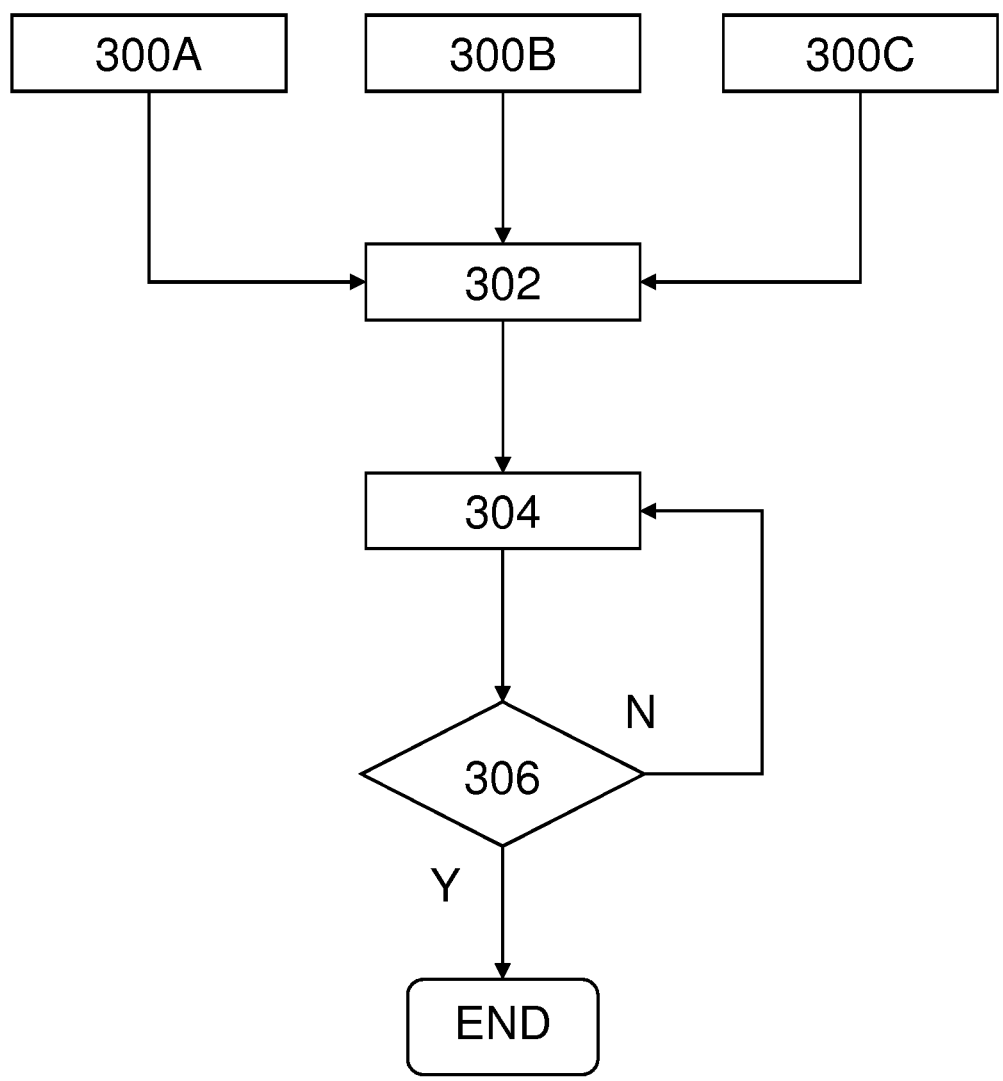
FIG. 4 shows a flow chart of a general method of optimizing the lithography projection apparatus.

A general method of optimizing the lithography projection apparatus, according to an embodiment, is illustrated in FIG. 4. This method comprises a step 302 of defining a multi-variable objective function of a plurality of design variables. The design variables may comprise any suitable combination selected from: one or more characteristics of the illumination mode (300A) (e.g., pupil fill ratio, namely percentage of radiation of the illumination that passes through a pupil or aperture), one or more characteristics of the projection optics (300B) and/or one or more characteristics of the patterning device pattern (300C). For example, the design variables may include characteristics of the illumination mode (300A) and characteristics of the patterning device pattern (300C) (e.g., global bias) but not characteristics of the projection optics (300B), which leads to a SMO. Alternatively, the design variables may include characteristics of the illumination mode (300A), characteristics of the projection optics (300B) and characteristics of the patterning device pattern (300C), which leads to an optimization of the illumination, the patterning device pattern and the projection optics (sometimes referred to as a source-mask-lens optimization (SMLO)). In step 304, the design variables are simultaneously adjusted so that the objective function is moved towards convergence. In step 306, it is determined whether a predefined termination condition is satisfied. The predetermined termination condition may include various possibilities, e.g., the objective function may be minimized or maximized, as required by the numerical technique used, the value of the objective function is equal to a threshold value or has crossed the threshold value, the value of the objective function has reached within a preset error limit, and/or a preset number of iterations of the objective function evaluation is reached. If a termination condition in step 306 is satisfied, the method ends. If the termination condition in step 306 is not satisfied, the steps 304 and 306 are iteratively repeated until a desired result is obtained. The optimization does not necessarily lead to a single set of values for the design variables because there may be physical restraints caused by factors such as the pupil fill factor, the resist chemistry, the throughput, etc. The optimization may provide multiple sets of values for the design variables and associated performance characteristics (e.g., the throughput) and allows a user of the lithographic apparatus to pick one or more sets.

In an embodiment, instead of, or in addition to, calculating and/or determining the effect on the optical characteristics of the illumination system and/or projection optics, it is envisioned that adjustable optical characteristics of the illumination system and/or projection optics can be included in the design variables. Exemplary adjustable optical characteristics may include one or more lens manipulators, temperature data or a signal associated with temperature data of one or more devices, e.g. a heater, utilized to control the temperature of an optical element of the illumination system and/or projection system, one or more Zernike coefficients, etc. The SMO or SMLO procedure can then be carried out and the design variables, including the adjustable optical characteristics, can be simultaneously adjusted so that the objective function is moved towards convergence.

In FIG. 4, the optimization of all the design variables is executed simultaneously. Such flow may be called the simultaneous optimization, joint optimization, or co-optimization. The terms "simultaneous", "simultaneously", "joint" and "jointly" as used herein mean that the design variables of the characteristics of the illumination mode, patterning device, projection optics and/or any other design variables, are allowed to change at the same time.

Figure 5:
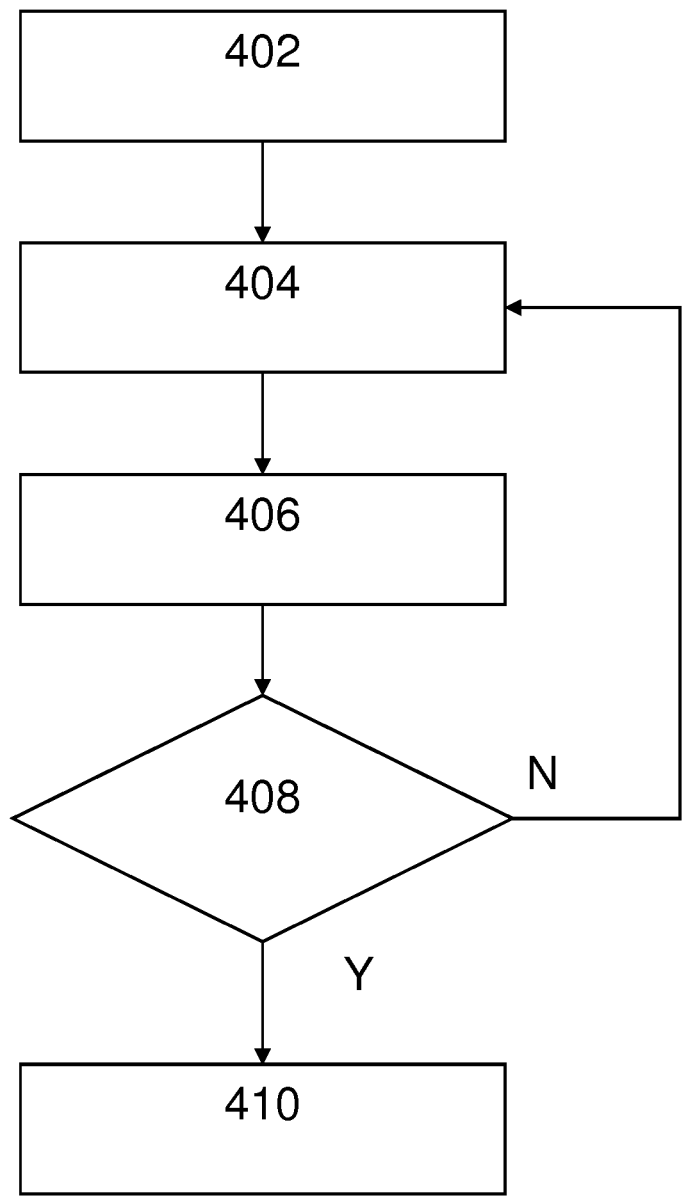
FIG. 5 shows a flow chart of a method of optimizing the lithography projection apparatus where the optimization of all the design variables is executed alternately.

Alternatively, the optimization of all the design variables is executed alternately, as illustrated in FIG. 5. In this flow, in each step, some design variables are fixed while the other design variables are optimized as part of evaluation of the objective function; then in the next step, a different set of variables are fixed while the others are optimized as part of evaluation of the objective function. These steps are executed alternately until convergence or certain terminating conditions are met. As shown in the non-limiting example flowchart of FIG. 5, first, a patterning device pattern (step 402) is obtained, then a step of illumination mode optimization is executed in step 404, where all the design variables of the illumination mode are optimized (SO) as part of evaluation of a suitable objective function while all the other design variables are fixed. Then in the next step 406, a mask optimization (MO) is performed, where all the design variables of the patterning device are optimized as part of evaluation of a suitable objective function while all the other design variables are fixed. These two steps are executed alternately, until certain terminating conditions are met in step 408. Various termination conditions can be used, such as, the value of the objective function becomes equal to a threshold value, the value of the objective function crosses the threshold value, the value of the objective function reaches within a preset error limit, or a preset number of iterations of evaluation of the objective function is reached, etc. Note that SO-MO-Alternate-Optimization is used as an example for the alternative flow. The alternate flow can take many different forms, such as SO-LO-MO-Alternate-Optimization, where SO, LO (Lens Optimization) is executed, and MO alternately and iteratively; or first SMO can be executed once, then execute LO and MO alternately and iteratively; and so on. Finally the output of the optimization result is obtained in step 410, and the process stops.

The pattern selection algorithm, as discussed before, may be integrated with the simultaneous or alternate optimization. For example, when an alternate optimization is adopted, first a full-chip SO can be performed, the 'hot spots' and/or 'warm spots' are identified, then a MO is performed. In view of the present disclosure numerous permutations and combinations of sub-optimizations are possible in order to achieve the desired optimization results.

Figure 6:
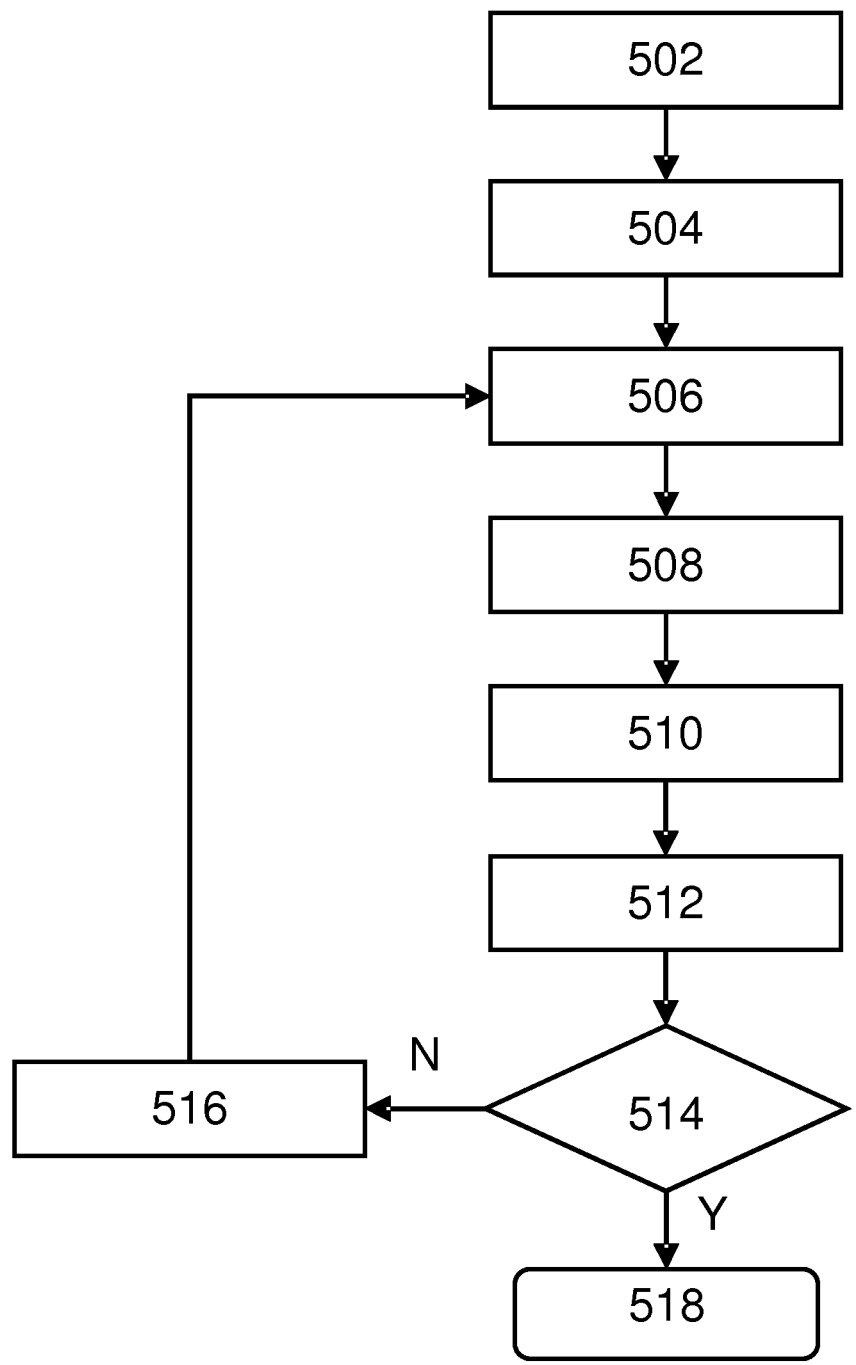
FIG. 6 shows one exemplary method of optimization.

FIG. 6 shows one exemplary method of optimization, where an objective function is defined and evaluated. In step 502, initial values of design variables are obtained, including their tuning ranges, if any. In step 504, the multi-variable objective function is set up. In step 506, the objective function is expanded within a small enough neighborhood around the starting point value of the design variables for the first iterative step (i=0). In step 508, standard multi-variable optimization techniques are applied to minimize or maximize the objective function. Note that the optimization can have constraints, such as tuning ranges, during the optimization process in 508 or at a later stage in the optimization process. Each iteration is evaluated using given test patterns (also known as "gauges") for the identified evaluation points that have been selected to optimize the lithographic process. In step 510, a lithographic response (e.g., one or more certain characteristics of an aerial image, one or more certain characteristics of a resist image, or one or more certain characteristics of the lithographic process such as the process window) is predicted. In step 512, the result of step 510 is compared with a desired or ideal lithographic response value. If the termination condition is satisfied in step 514, i.e. the optimization generates a lithographic response value sufficiently close to the desired value, and then the final value of the design variables is outputted in step 518. The output step may also include outputting other functions using the final values of the design variables, such as outputting a wavefront aberration-adjusted map at the pupil plane (or other planes), an optimized illumination mode map, an optimized patterning device pattern (e.g., including optical proximity corrections), etc. If the termination condition is not satisfied, then in step 516, the values of the design variables is updated with the result of the i-th iteration, and the process goes back to step 506. An algorithm, such as the Gauss-Newton algorithm, the Levenberg-Marquardt algorithm, the gradient descent algorithm, simulated annealing, the genetic algorithm, etc. can be applied to evaluate and solve the objective function.

Optimizing a patterning process can expand the process window. A larger process window provides more flexibility in process design and device design. The process window can be defined as a set of focus and dose values for which the resist image are within a certain limit of the design target of the resist image. Note that all the methods discussed here may also be extended to a generalized process window definition that can be established by different or additional base parameters in addition to or other than exposure dose and defocus. These may include, but are not limited to, optical settings such as NA, optical sigma, optical aberrations, polarization, or optical constants of the resist layer. For example, as described earlier, if the PW also involves different mask bias, then the optimization can include the minimization of MEEF. The process window defined on focus and dose values only serve as an example in this disclosure.

A method of maximizing the process window, according to an embodiment, is described below. In a first step, starting from a known condition $(f_0, \varepsilon_0)$ in the process window, wherein $f_0$ is a nominal focus and $\varepsilon_0$ is a nominal dose, there is performed minimization of one of the example objective functions below in the vicinity $(f_0 \pm \Delta f, \varepsilon_0 \pm \varepsilon)$:

$$CF(z_1, z_2, \ldots, z_N, f_0, \varepsilon_0) = \min_{(f,\varepsilon)=(f_0 \pm \Delta f, \varepsilon_0 \pm \varepsilon)}(\max \max_p |f_p(z_1, z_2, \ldots, z_N, f, \varepsilon)|) \quad (4)$$

or $$CF(z_1, z_2, \ldots, z_N, f_0, \varepsilon_0) = \min\left(\max\left(\sum_{(f,\varepsilon)=(f_0 \pm \Delta f, \varepsilon_0 \pm \varepsilon)} \sum_p w_p f_p^2(z_1, z_2, \ldots, z_N, f, \varepsilon)\right)\right) \quad (5)$$

If the nominal focus $f_0$ and nominal dose $\varepsilon_0$ are allowed to shift, they can be optimized jointly with the design variables $(z_1, z_2, \ldots, z_N)$. In the next step, $(f_0 \pm \Delta f, \varepsilon_0 \pm \varepsilon)$ is accepted as part of the process window, if a set of values of $(z_1, z_2, \ldots, z_N, f, \varepsilon)$ can be found such that the objective function is within a preset limit.

Alternatively, if the focus and dose are not allowed to shift, the design variables $(z_1, z_2, \ldots, z_N)$ are optimized with the focus and dose fixed at the nominal focus $f_0$ and nominal dose $\varepsilon_0$. In an alternative embodiment, $(f_0 \pm \Delta f, \varepsilon_0 \pm \varepsilon)$ is accepted as part of the process window, if a set of values of $(z_1, z_2, \ldots, z_N)$ can be found such that the objective function is within a preset limit.

The methods described earlier in this disclosure can be used to minimize the respective objective functions of equation (4) or (5). If the design variables are characteristics of the projection optics, such as the Zernike coefficients, then minimizing the objective functions of equation (4) or (5) leads to process window maximization based on projection optics optimization, i.e., LO. If the design variables are characteristics of the illumination mode and patterning device pattern in addition to those of the projection optics, then minimizing the objective function of equation (4) or (5) leads to process window maximizing based on SMLO. If the design variables are characteristics of the illumination mode and the patterning device pattern, then minimizing the objective functions of equation (4) or (5) leads to process window maximization based on SMO.

The optimization described above may be used to find a set of values of $(z_1, z_2, \ldots, z_N)$ to reduce many physical effects that may be adverse to the lithographic process. Multiple optimizations may be conducted in series for different physical effects, on different components of the lithographic apparatus, and under different conditions.

Now, a parameter of a patterning process (e.g., CD, overlay, focus, etc.) can be sensitive to optical aberration of an apparatus (such as the lithographic apparatus) used in the patterning process and typically appropriate corrections/control are determined to compensate for errors due to optical aberrations during a patterning process. As described above, the modeling used to setup, modify, etc. a patterning process can account for optical aberration of a lithographic apparatus, but the modeling would then be apparatus dependent. Accounting for optical aberration of each apparatus can involve substantial measurements and related computation of the contribution of optical aberration on the patterning process. Furthermore, more than one lithographic apparatus may be used with the patterning process, each lithographic apparatus having a particular optical aberration characteristic, and so creation of a patterning device using modeling with apparatus dependent aberration drastically limits the useful of the patterning device.

So, it is desired to generate and apply process models that account for optical aberration such that the models do not have to account for the individual optical aberration of an apparatus used in the patterning process. So, in an embodiment, there is described herein a technique that uses an average optical aberration of a plurality of apparatuses in the use and/or generation of a process model (e.g., an OPC model, an aerial image model, etc.) so as to at least partially account for optical aberration occurring in a patterning process. For example, the average optical aberration may be included in an OPC model, which in determining an optical proximity correction of a patterning device may modify the design layout in order to achieve a higher fidelity of the projected image of the target design. The OPC model can apply one or more OPC corrections, such as shifting or biasing of edge positions or feature widths and/or application of one or more assist features, that are intended to assist imaging of main features of the design layout based on the impact of the average optical aberration of lithographic apparatuses so as to account at least partially for an optical aberration expected to occur during the patterning process.

An OPC model is used by way of example herein to explain the technique, but the technique is not limited to an OPC model and any model discussed herein may be modified to include average optical aberrations. The process model may be any model that is used to design, improve and/or optimize one or more aspects of a patterning process, including any apparatus of the patterning process. For example, the average optical aberrations can be implemented in a patterning device/design layout model, a model that determines the impact of a process variable on a parameter of the patterning process such as an overlay model, a focus model, and/or CD model, a control model, a source-mask optimization model, a resist model, an imaging model, a measurement model (e.g., that models the process of measuring), etc. In an embodiment, the average optical aberration may be applied to setup or improve a patterning process prior to execution of the patterning process, for example, to determine a patterning device layout and/or illumination mode that accounts for the average optical aberration. In an embodiment, the average optical aberration may be applied during a patterning process, for example, to determine a control/compensation that may be applied to an optical element of the projection system of a lithographic apparatus, applied to a level control of the substrate, etc.

Further, while focus is placed on the optical aberration of a lithographic apparatus, other apparatuses may have optical aberration which impacts the patterning process. For example, a measurement system may have an optical aberration and so average aberrations of a plurality of measurement system can be account for in the design, correction, etc. of a patterning process (e.g., in this case the measurement aspect of the patterning process) based on average optical aberration.

Figure 7:
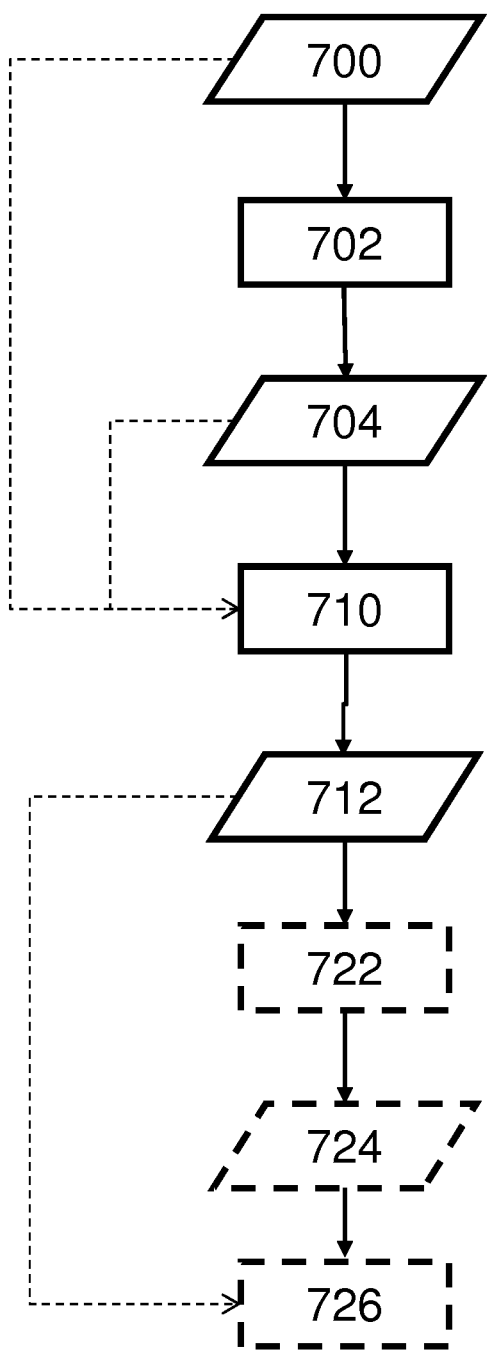
FIG. 7 shows a flow for a method of determining an average value of optical aberration, according to an embodiment.

FIG. 7 schematically shows a flow for a method for applying a process model that includes average optical aberration, according to an embodiment. In this method, an average optical aberration 700 of one or more lithographic apparatuses is used in and/or to generate a process model 704. The process model 704 with the average optical aberrations 700 may then be applied to a patterning process employing one or more of the one or more lithographic apparatuses or employing a lithographic apparatus of the type of one or more of the one or more lithographic apparatuses.

In an embodiment, the average optical aberration 700 of projection systems of a plurality of lithographic apparatuses is obtained and/or generated. The optical aberrations of each lithographic apparatus may be measured and/or computed and the average optical aberration 700 may be determined by summing the total of the optical aberrations of the lithographic apparatuses divided by the total number of lithographic apparatuses. An example computation of the average optical aberration for six lithographic apparatuses is further discussed with respect to FIGS. 11A-11C and 12A-12C. However, the present disclosure is not limited to a certain number of lithographic apparatuses and may be obtained for two or more lithographic apparatuses (e.g., 2, 4, 5, 6, 10, etc.).

In an embodiment, the lithographic apparatuses are those from a pool of lithographic apparatuses produced by a lithographic apparatus manufacturer (e.g., not necessarily provided to a device manufacturer). In an embodiment, the lithographic apparatuses are those used with a particular patterning process (e.g., the lithographic apparatuses at a particular device manufacturing company or facility). In an embodiment, the lithographic apparatuses are those designed to use EUV radiation. That is, in an embodiment, the aberrations are obtained from the primarily reflective optical system of an EUV lithographic apparatus.

In an embodiment, the average may be a weighted average, where each lithographic apparatus may be assigned a particular weight, for example, based on the usage (e.g., more weight may be assigned to a lithographic apparatus used relatively more than one or more other lithographic apparatuses) or order in which the lithographic apparatus is used in the process (e.g., more weight may be assigned to lithographic apparatus occurring first and relatively less weights may be assigned to lithographic apparatus occurring later in the patterning process). In an embodiment, the weighted average may be such that one or more values are omitted or otherwise modified.

In process 702, the process model 704 (e.g., an OPC model, an aerial image model, etc.) may be generated or updated to include the average optical aberrations 700 in the process model. Such a process model 704 may be configured to determine an adjustment to a parameter (e.g., CD of a pattern feature, wavefront, control parameter, etc.) of the patterning process to account for the average optical aberration. The adjustment may be a correction, a modification, etc. determined based on the average optical aberration and any other variables of the process model 704. For example, the adjustment may be to increase or decrease a dimension of a feature in a patterning device pattern and/or add or modify an assist feature in a patterning device pattern as part of use of an OPC model, to modify a wavefront or illumination as part of use of an illumination model, to control of an optical element of the projection system as part of use of a projection optics model, to control substrate levelling as part of use of a substrate position control model, to reduce or minimize an overlay error as part of use of an overlay model, etc.

As mentioned above, in an embodiment, the process model 704 is an optical proximity correction model that includes the average optical aberrations. Such an OPC model is used to determine adjustment to the patterning device pattern including, for example, adjustment to a feature dimension, assist feature placement or modification, etc. and such an OPC model placement including average optical aberrations can then be used to make the adjustments accounting for the average optical aberrations so as to modify or optimize the patterning device pattern layout for improved pattern transfer to the substrate during the patterning process.

In process 710, the process model 704 with the average optical aberration may be applied to obtain a correction/control/improvement/modification 712 in a process variable (e.g., an OPC correction) related to a parameter (e.g., CD) of the patterning process. Applying the average optical aberration may improve the throughput and/or yield of the patterning process.

In optional process 722, a nominal model (e.g., nominal OPC model) that does not account for the average optical aberrations may be used to generate a correction/control/improvement/modification 724 in the process variable (e.g., an OPC correction) related to the parameter (e.g., CD) of the patterning process. The nominal model can take all, or most of, the same inputs as at process 702 and model 704. Further, in optional process 726, the results 712 and 724 may be compared with a reference (e.g., a model having the particular optical aberrations of the lithographic apparatus that is being used and that model is then used with the process variables generated in processes 710 and 722) and used to evaluate a performance parameter (e.g., percentage improvement with respect to a design intent or reference) to determine whether the results 712 are adequately improved compared to 724.

The improvements in a patterning process using the process model 704 is further illustrated using several test features (e.g., two parallel bars with a certain pitch arranged in the horizontal and in the vertical in the plane of the patterning device pattern) in FIGS. 8A-8D.

Figure 8A:
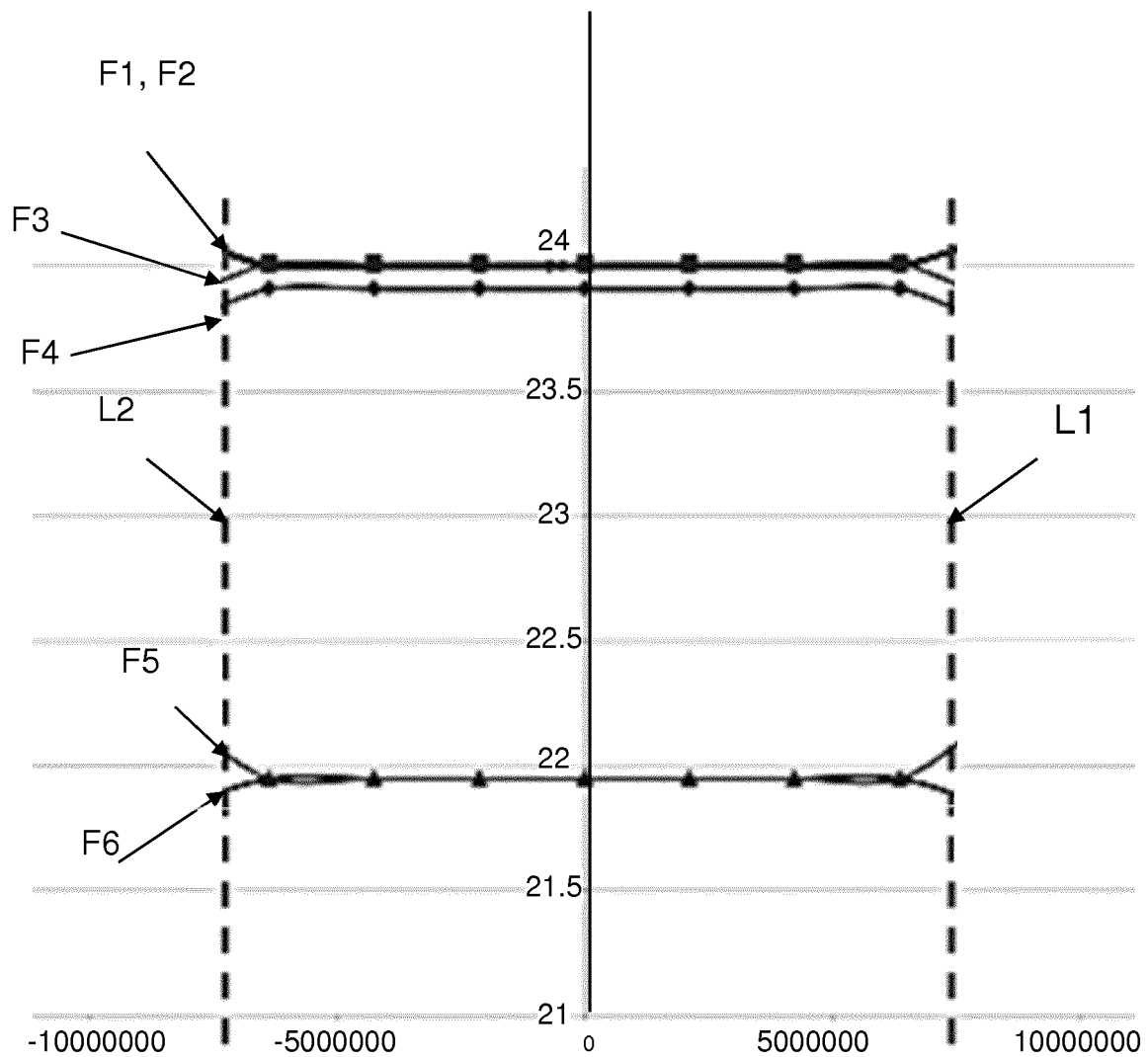
FIG. 8A illustrates an example result of a pattern generated using a nominal process model without optical aberrations, according to an embodiment.

FIG. 8A illustrates an example result of a nominal (or ideal) process model that assumes there are no optical aberrations in a projection system and applies nominal OPC model corrections (e.g., to a patterning device pattern) based on such an assumption. In other words, the nominal model does not account for any optical aberrations. The graph along the vertical axis shows the predicted CD of the various test features and the graph along the horizontal axis shows the location along a certain dimension of the exposure field (e.g., along the length or width of the exposure field) with the 0 location corresponding to a center of the exposure field of the associated predicted CD values. As is known in the art, the exposure field (e.g., in the form of an elongate slit) is used to expose a patterning device pattern onto the substrate during the patterning process.

The results or predictions indicate that the CD of the features may be uniformly printed on the substrate within a certain region (i.e., bounded between the dotted lines L1 and L2) of the exposure field. In the example, four different features F1, F2, F3, and F4, each having a nominal CD of 24 nm, are fairly uniformly and accurately printed along the field in the region between L1 and L2, and two different features F5 and F6, each having a nominal CD of 22 nm, are also fairly uniformly and accurately printed along the field in the region between L1 and L2. In this example, the features F1 and F2 are vertically aligned adjacent bars and feature F5 is the gap between the bars of F1 and F2 and features F3 and F4 are horizontally aligned adjacent bars and feature F6 is the gap between the bars of F3 and F4.

Figure 8B:
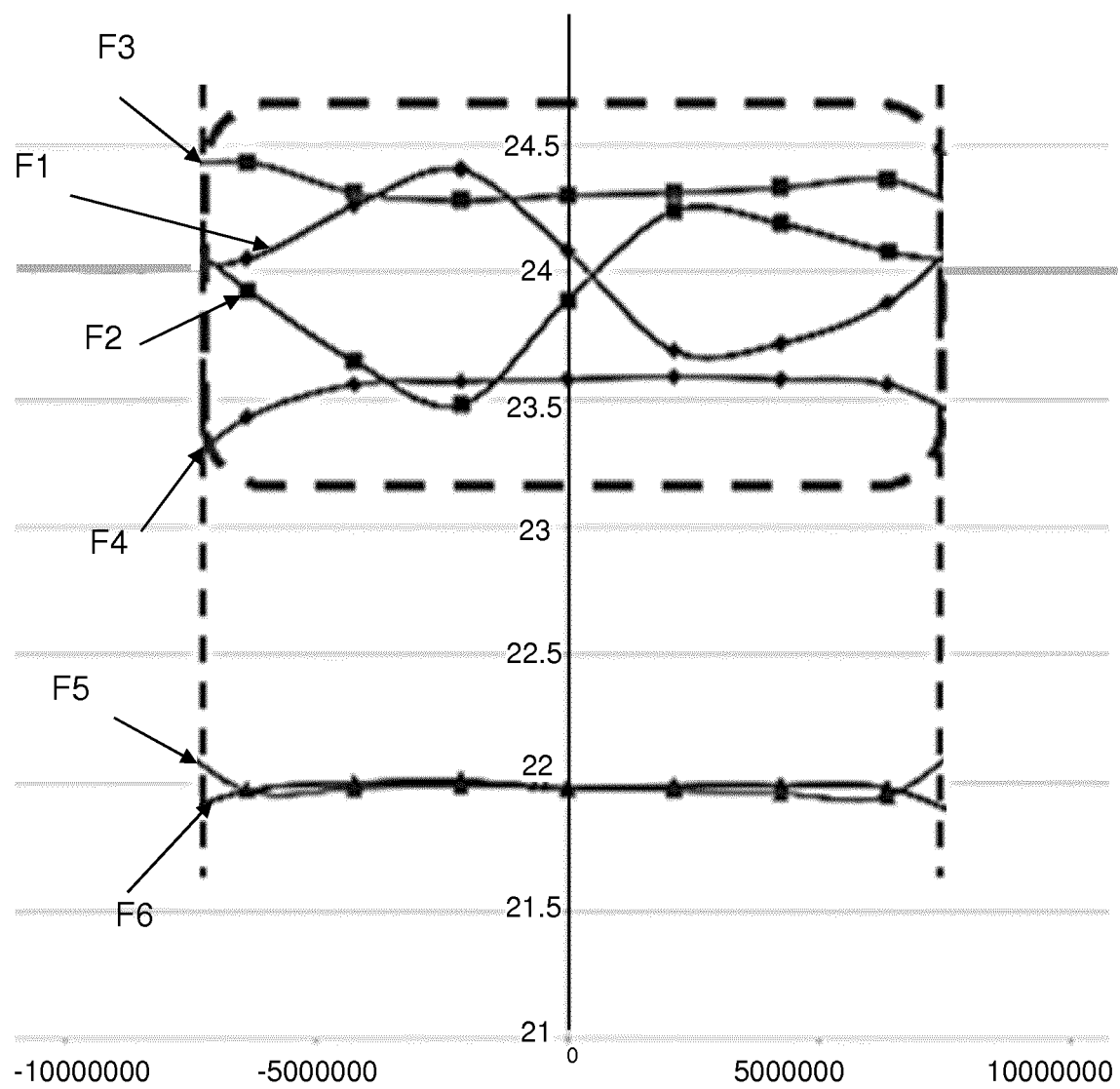
FIG. 8B illustrates an example result of the pattern generated for FIG. 8A using an optical proximity correction model having the optical aberrations for a specific lithography apparatus, according to an embodiment.

Now, FIG. 8B illustrates an example result of a process model that incorporates the projection system optical aberrations of a particular lithographic projection apparatus using the patterning device pattern having the OPC corrections made using the model of FIG. 8A. The predicted result using this process model shows that the CD of features F1-F4 vary substantially between 23 and 24.5 nm along the field in the region between L1 and L2 compared to the results shown in FIG. 17A for the region between L1 and L2. The variation in the critical dimension is at least in part due to the optical aberration of the projection system of the lithographic apparatus.

So, it is desirable to reduce the variation in CD shown in FIG. 8B. This can be done by using a model that accounts for the average optical aberration of a plurality of lithographic apparatuses according to the present disclosure. While, of course, the model of FIG. 8B could be used to create improved OPC corrections for the particular lithographic apparatus considered in FIG. 8B, the result would be a patterning device pattern specifically tuned for that lithographic apparatus, which severely limits the usefulness of the patterning device. It has been discovered that an average optical aberration can yield significantly improved results for various lithographic apparatuses even though an individual lithographic apparatus may not have optical aberrations that match the average optical aberrations.

So, by having a model that incorporates average optical aberrations, the model can, for example, arrive at a correction/control/improvement/modification in a process variable (e.g., an OPC correction) that effectively inverts most, if not all of, the aberration effects of the projection system of a lithographic apparatus. The inverse of the aberration effect may be applied to, for example, a patterning device pattern to pre-correct the patterning device pattern for the average optical aberration, and so which pre-correction will then be able to correct for at least part of an actual optical aberration experienced by the patterning device pattern.

Figure 8C:
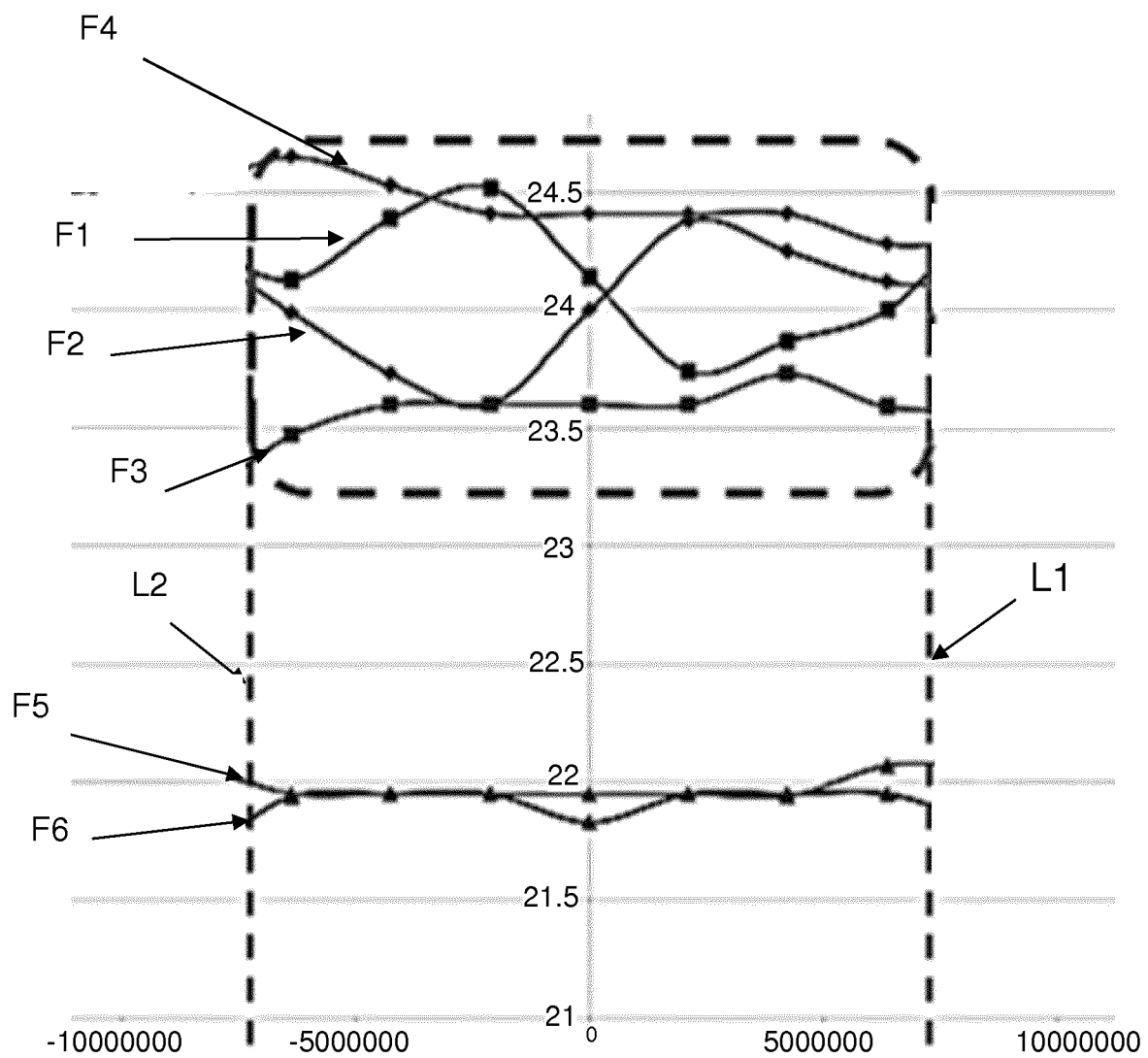
FIG. 8C illustrates an example result of a pattern generated using a nominal process model for a pattern created using a process model including average optical aberrations, according to an embodiment.

This inversion can be seen in FIG. 8C. This graphs shows the predicted results using a nominal model (e.g., without aberrations) using a patterning device pattern having OPC corrections made with a process model having average optical aberrations. When compared to FIG. 8B, it can be seen that size changes for much of the features F1-F4 have been reversed. For example, where feature F4 in FIG. 8B was under 24 nm for much of the exposure field, the feature F4 in FIG. 8C is over 24 nm for much of the exposure field. While this would be unsatisfactory for a projection system that has no optical aberrations, the result would be entirely different with a projection system having optical aberrations. In particular, when an optical aberration is applied to the OPC corrected feature F4, the net result should be feature F4 having its CD close to the nominal 24 nm CD. So, while the impact of such pre-correction on the patterning device pattern when considering a nominal model without optical aberration would lead to substantial variation in CD (as shown in FIG. 8C) compared to the results in FIG. 8A, the pre-correction obtained using a process model that accounts for average optical aberrations when applied with a projection system having optical aberrations effectively inverts most, if not all of, the aberration effects of the aberrations of the projection system to produce a substantially better result, as shown in FIG. 8D.

Figure 8D:
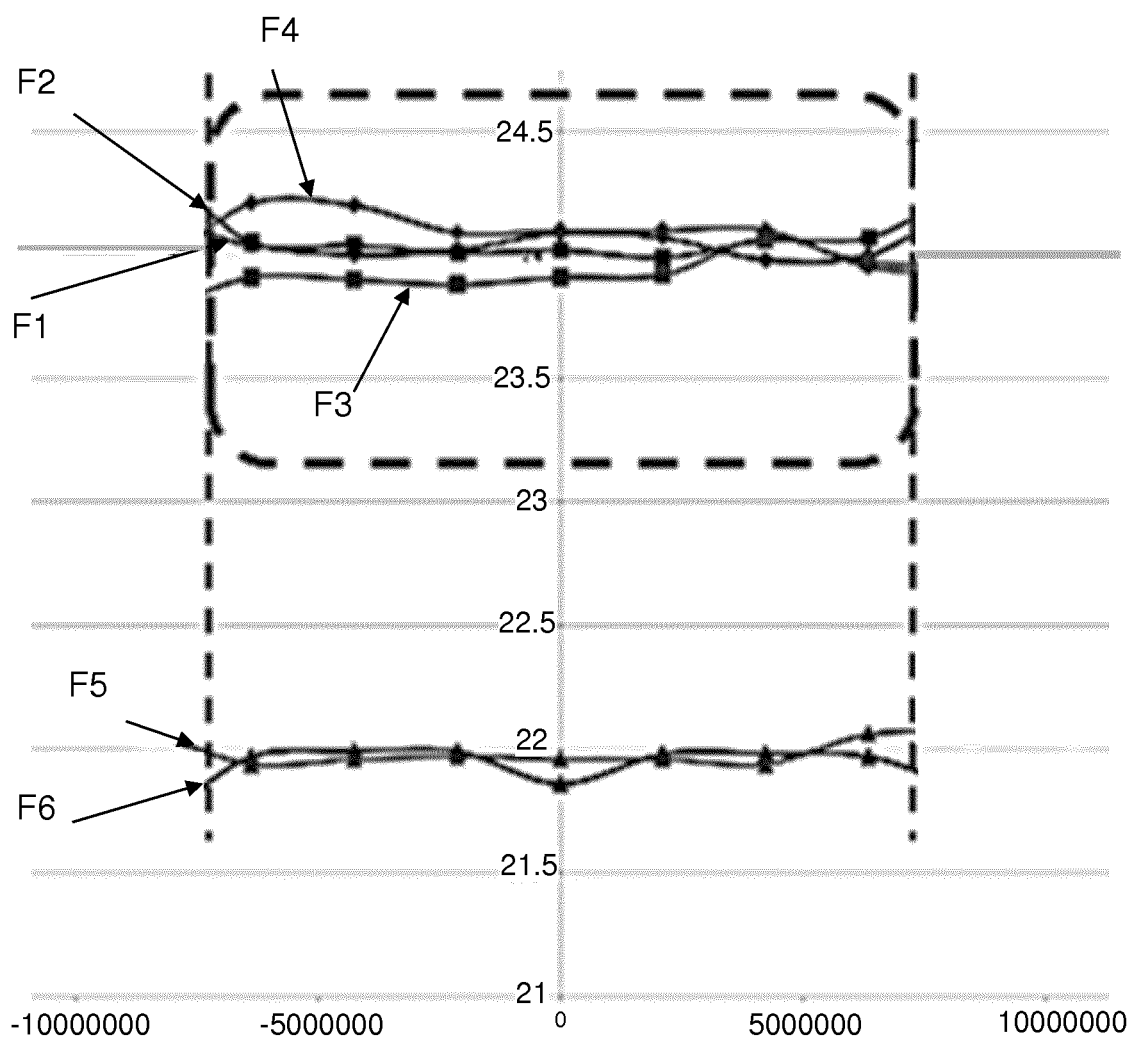
FIG. 8D illustrates an example result of the pattern generated for FIG. 8C using an optical proximity correction model having the optical aberrations for a specific lithography apparatus, according to an embodiment.

FIG. 8D illustrates an example result of a process model that incorporates the projection system optical aberrations of a particular lithographic projection apparatus (namely the same optical aberrations as used for FIG. 8B) using the patterning device pattern having the OPC corrections made using the model that includes average optical aberrations (and for which results are shown in FIG. 8C using a nominal model without optical aberrations). As shown in FIG. 8D, the four features F1-F4 have a CD of approximately 24 nm even though the projection system of the lithographic apparatus has optical aberrations, thus showing substantially reduced variation compared to the results of FIG. 8B where the OPC corrections were made using a model that didn't account for optical aberrations. Hence, significantly improved results may be obtained when the average optical aberrations are considered in the process modelling and/or simulations.

Figure 9:
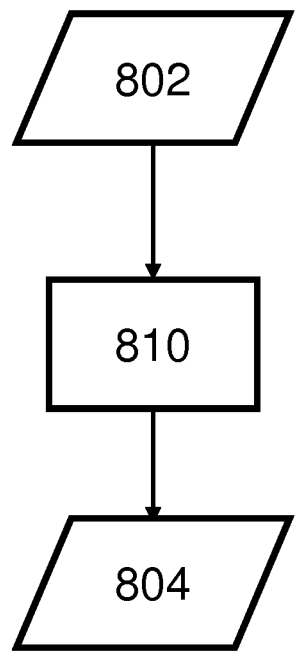
FIG. 9 shows a flow for a method for applying a process model that includes average optical aberration, according to an embodiment.
Figure 10:
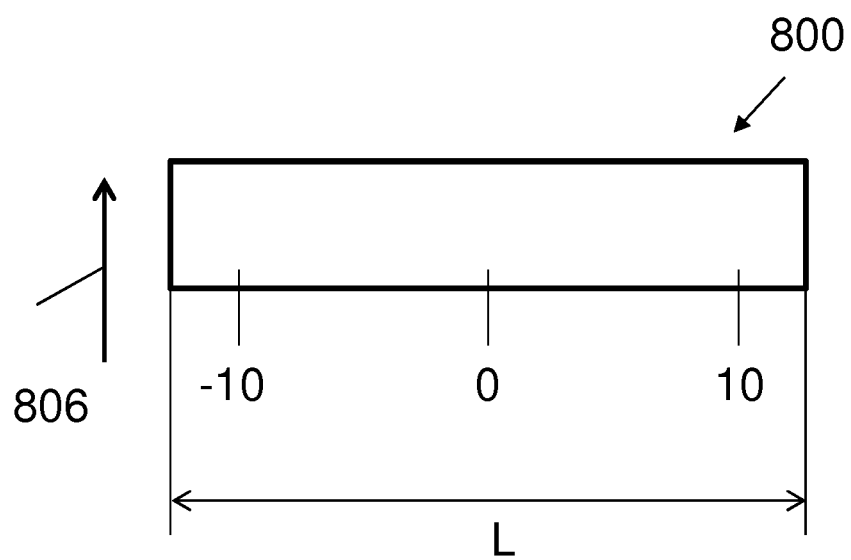
FIG. 10 schematically shown an exposure field according to an embodiment.

FIG. 9 shows a flow for a method of determining an average value of optical aberrations, according to an embodiment. In this method, values of optical aberration 802 may be obtained and/or generated. The optical aberration values 802 may be measured and/or simulated values at different locations along an exposure field (e.g., a slit). By using the exposure field location, variation in aberrations can be evaluated. In an embodiment, as shown in FIG. 10, the optical aberrations may be measured at different locations along a length L of an exposure field 800 using, for example, a shearing interferometer as described herein. The relationship between the orientation of the exposure field and the scanning direction 806 is also shown in FIG. 10. In an embodiment, the optical aberrations may be characterized by a curve-fitting, for example, by a Zernike polynomial at each location along the length L of the exposure field 800. Example optical aberrations characterized in terms of Zernike polynomials for projection systems of six different lithographic apparatuses are illustrated in FIGS. 11A-11C and FIGS. 12A-12C.

In an embodiment, the optical aberrations of each of the apparatuses may have a variability within a certain limit. For example, where the aberration is measured in terms of nanometers, the variability may be within ±0.2 nanometers. The variability in optical aberrations may be measured to determine whether the apparatus should be included in the patterning process or the average optical aberrations for the process model. For example, if an apparatus has optical aberrations that vary substantially with respect to other apparatus, then such an apparatus may be corrected in terms of its optical aberrations or replaced before use in the patterning process or as part of the determination of the average optical aberrations for the process model.

In an embodiment, the optical aberrations are obtained from a plurality of lithographic apparatuses used in a patterning process at, for example, a device manufacturing company or facility. In an embodiment, the optical aberrations are obtained from a plurality of lithographic apparatuses of the type used in a patterning process at, for example, a device manufacturing company or facility. For example, the plurality of lithographic apparatus may be produced by the manufacturer but not sold, leased, etc. to the device manufacturing company or facility. In an embodiment, the optical aberrations can be a combination of one or more lithographic apparatuses at a device manufacturing company or facility and one or more lithographic apparatuses not at a device manufacturing company or facility (e.g., at the manufacturer of the one or more lithographic apparatuses).

In step 810, an average optical aberration 804 of the plurality of lithographic apparatuses is determined. The average optical aberration 804 may be determined by summing the total of the optical aberrations of the lithographic apparatuses and dividing by total number of lithographic apparatuses.

In an embodiment, the average optical aberration 804 is determined at each of a plurality of locations of an exposure field. So, for example, the average can be obtained for each location by taking the average of the optical aberrations from the lithographic apparatuses at the comparable location in the exposure field of those lithographic apparatuses. Referring to FIG. 11, the average optical aberration 804 may be evaluated at a center 0 of the exposure field 800, at ±1 mm from the center, at ±2 mm from the center, at ±3 mm from the center, and so on. In an embodiment, the increments from the center may be 0.1 mm, or 0.2 mm, or 0.5 mm, or 1.5 mm, or 2 mm, etc. for example, as chosen for the particular application (e.g., a smaller increment should yield increase accuracy at the expense of computation time).

In an embodiment, the average optical aberration 804 is determined for a particular one or more types of optical aberration. For example, the average optical aberration 804 can be determined for a particular type of aberration represented by a certain Zernike polynomial. In an embodiment, the average optical aberration can be determined for each of a plurality of different types of optical aberration. In an embodiment, the average optical aberration is determined for a collective group of more than one type of optical aberration (e.g., an average for aberrations defined by two or more different Zernike polynomials). As will be appreciated, the determination of the average optical aberration per one or more particular optical aberration types can be combined with the determination of the average at the plurality of locations along the exposure field.

As noted above, the average may be a weighted average, where each lithographic apparatus may be assigned a particular weight. For example, the weighting can be based on the order in which lithographic apparatus is used in the process (e.g., more weight may be assigned to lithographic apparatus occurring first and relatively less weight may be assigned to a lithographic apparatus occurring later in the patterning process), or usage (e.g., more weight may be assigned to a lithographic apparatus used relatively more than one or more other lithographic apparatuses). In an embodiment, the weighted average may be such that one or more values are omitted or otherwise modified.

In an embodiment, the average used in the optical model may be a weighted average of the different averages per particular type of optical aberration. For example, the average of one or more certain Zernikes can be weighted higher for one or more particular exposure field locations than another one or more other certain Zernikes for those one or more particular exposure field locations. For example, one or more certain Zernikes (e.g. Noll index 4) may be more readily corrected for in the lithographic apparatus using one or more optical elements in the projection system and so their average(s) can be weighted lower than the average(s) of one or more other Zernikes that are not as readily corrected by an optical element in the lithographic apparatus (and so should be pre-corrected for using, for example, an OPC correction).

Figure 11A:
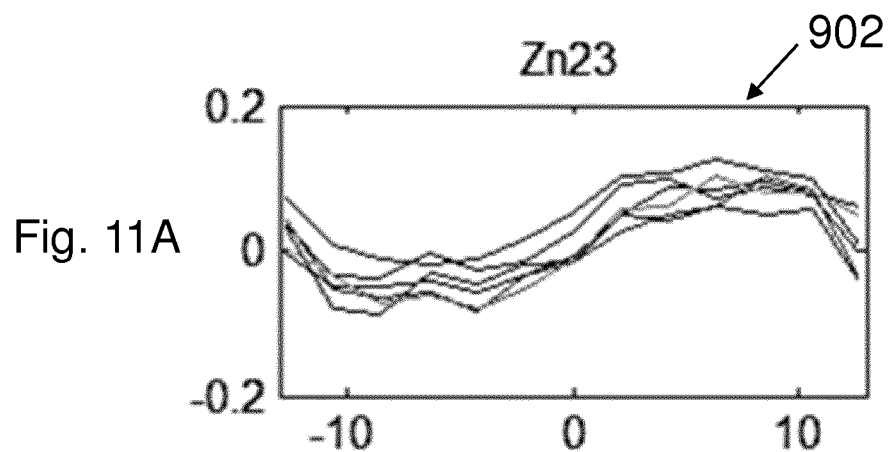
FIG. 11A, FIG. 11B and FIG. 11C illustrate respectively an example of optical aberrations according to a certain Zernike polynomial, average values of the optical aberration of the certain Zernike polynomial, and optical aberration values with the average optical aberrations removed, according to an embodiment.
Figure 11B:
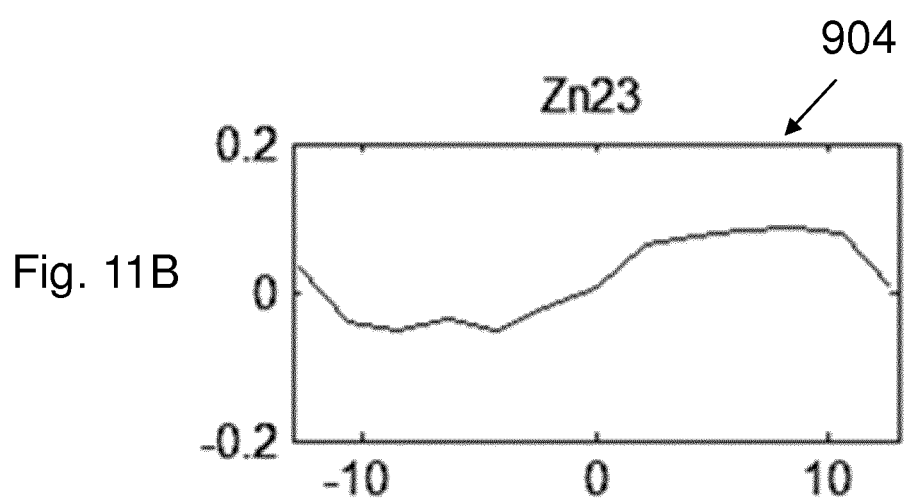
Figure 11C:
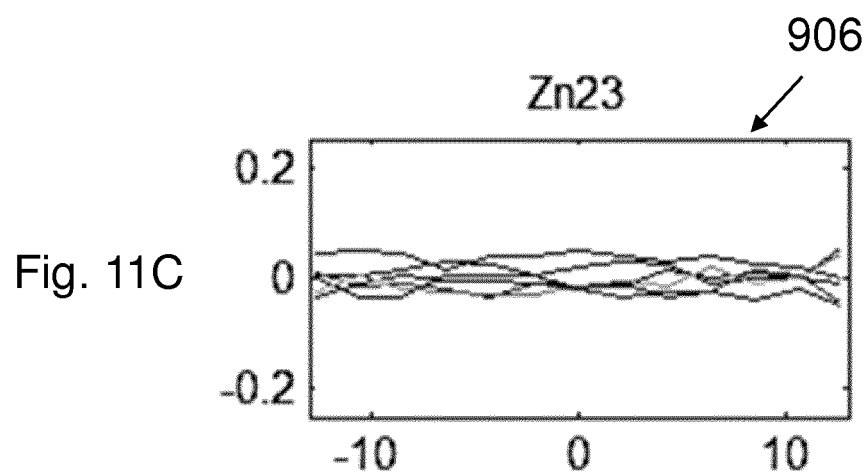

FIGS. 11A, and 11B and 11C illustrate an example of optical aberrations characterized by a particular Zernike polynomial, in this case the 23rd Zernike polynomial, e.g., Noll index 23. In this example, the optical aberrations are for six different apparatuses. FIG. 11A shows the raw optical aberrations for each of the six lithographic apparatuses (each line corresponding to a different lithographic apparatus) across an exposure field. The horizontal axis corresponds to the exposure field location with 0 being the center of the exposure field and the vertical axis corresponds to the amount of optical aberration (in this case, in nm). The optical aberrations 902 are determined at each of a plurality of field locations, for example, from −13 mm to 13 mm from the center 0 of the field (e.g., at −13 mm, −12 mm, . . . , −1 mm, 0, 1 mm, . . . , 13 mm). As seen in FIG. 11A, the optical aberrations 902 for each of the apparatuses have a substantial variation, for example, variations within about 0.2 nm along the length of the exposure field.

FIG. 11B shows average values 904 of the optical aberrations determined from the optical aberrations of FIG. 11A. The average optical aberration 904 is determined by the summing the optical aberrations of each of the six lithographic apparatuses at each location divided by the total number of apparatuses (i.e., 6). In an embodiment, this average can be used in the process models as described above.

FIG. 11C shows the optical aberration values of each of the six apparatuses with the average optical aberration removed. That is, the average optical aberration 904 may be removed from the initial optical aberrations 902, which results in residual aberrations 906 for each of the apparatuses, as shown in FIG. 11C. FIG. 11C shows that the residual optical aberrations 906 have substantially reduced variations compared to the initial optical aberrations 902 for each apparatus. Hence, the average optical aberration 904 can account for most of the optical aberration in each of the different apparatuses, leaving a relatively little amount of residual aberration. Thus, when such an average optical aberration 904 is used in the process model, the process model (e.g., as discussed with respect to FIGS. 8A-8D) can produce results that account for most, if not all, of the optical aberration expected to be experienced when using a particular lithographic apparatus.

Of course, the use of the average optical aberration holds when the variation between the various lithographic apparatuses is relatively small. That is, even if the variation across the exposure field is large, the average optical aberration will be effective if the difference in optical aberration between lithographic apparatuses at the particular exposure field locations is relatively small. In an embodiment, that difference should be less than 0.1 nm when the optical aberrations are defined in terms of Zernikes.

Figure 12A:
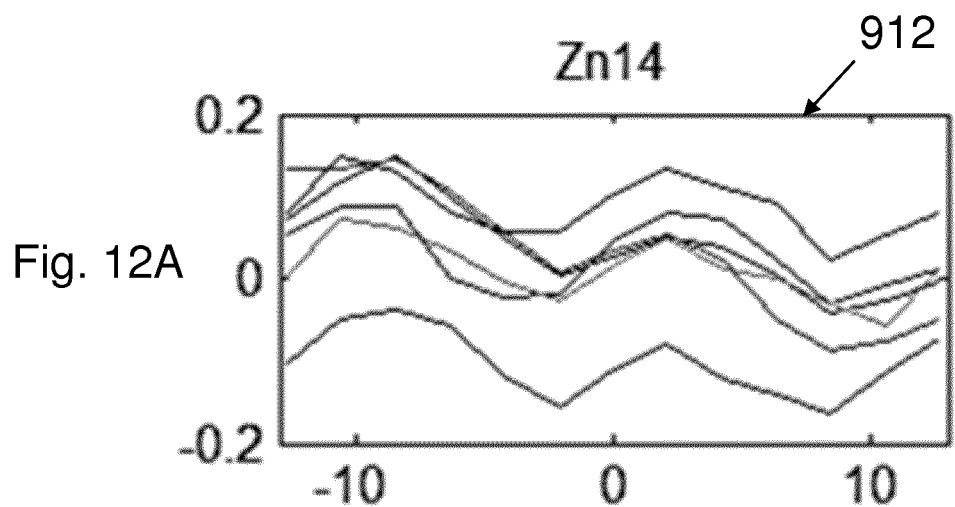
FIG. 12A, FIG. 12B and FIG. 12C illustrate respectively an example of optical aberrations according to another certain Zernike polynomial, average values of the optical aberration of the certain Zernike polynomial, and optical aberration values with the average optical aberrations removed, according to an embodiment.
Figure 12B:
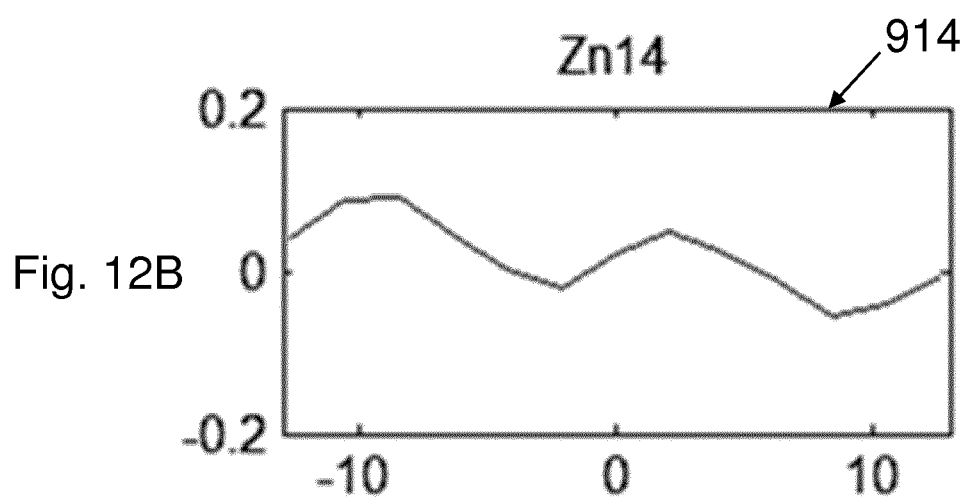
Figure 12C:
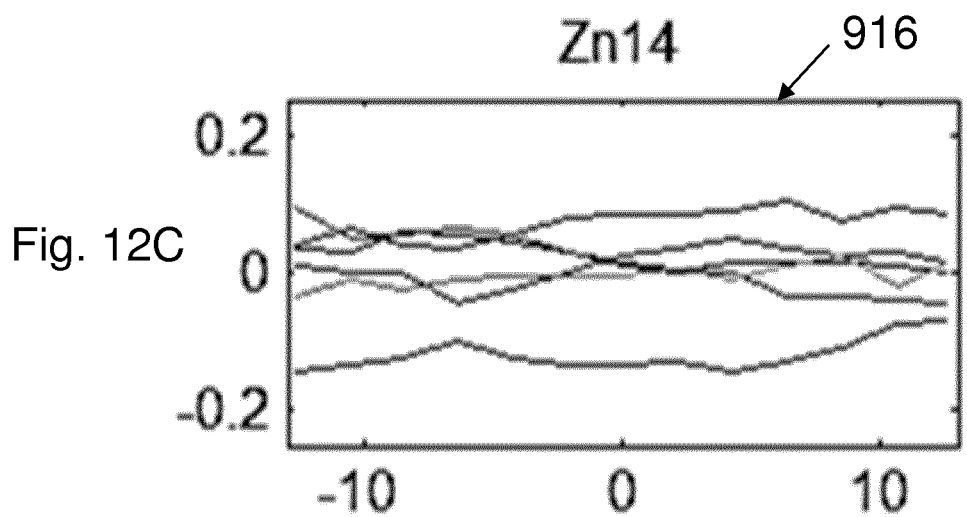

In another example, the optical aberration of a certain type, for example, represented by the $14^{th}$ Zernike polynomial (Noll index 14) may be only partially correctable by including an average optical aberration, as discussed with respect to FIGS. 12A-12C.

FIGS. 12A, 12B and 12C illustrate respectively an example of optical aberrations characterized by the $14^{th}$ Zernike polynomial, average values of the optical aberration, and optical aberration values with the average optical aberration removed, according to an embodiment. In FIG. 12A, optical aberrations 912, for the $14^{th}$ Zernike polynomial, show a relatively low variation for each apparatus and relatively similar variation between different apparatuses (note how the lines track each other fairly well). Indeed, the optical aberrations 912 may be considered to be less variable than the optical aberrations 902 (see FIG. 11A).

Based on the optical aberrations 912, an average optical aberration 914 (see FIG. 12B) may be determined in a similar manner as discussed earlier with respect to FIGS. 11A and 11B. Further, the average optical aberration 914 may be removed from the initial optical aberrations 912, which results in residual optical aberrations 916 for each of the apparatuses, as shown in FIG. 12C. FIG. 12C shows that the residual optical aberrations 916 have substantial variations and are not significantly improved compared to the initial optical aberrations 912 for each of the apparatuses. Hence, the average optical aberration 914 may not account for the variation in this particular type of optical aberration in the different apparatuses. This is because the difference in values of the optical aberrations between the different apparatuses has a significant impact. Thus, when such an average optical aberration 914 is used in the process model, the process model may not produce improved results. Accordingly, this can be addressed in any of a number of ways. For example, this type of optical aberration average can be weighted less (including possibly being completely removed) in the process model. Additionally or alternatively, this type of optical aberration can be addressed using another correction mechanism in the lithographic apparatus, such as a wavefront correcting optical element, by substrate level control, etc.

So, it has been realized that the (residual) aberrations in an apparatus used in the patterning process (such as the projection optics of lithographic apparatuses (such as EUV lithographic apparatuses)) can be mostly systematic from apparatus to apparatus compared to prior apparatuses. This opens the opportunity to use an average tool aberration fingerprint of the apparatuses into patterning process design, correction, etc. (such as into OPC modelling) to at least partially compensate (e.g., using this OPC model) for optical aberrations occurring in the patterning process due such an apparatus. A benefit of this approach is that the overall CD uniformity (CDU) and/or pattern shift uniformity (PSU) can be improved significantly while providing an apparatus independent patterning process correction, design, etc. process and/or model.

Accordingly, there are provided techniques that incorporate the average optical aberration of a plurality of apparatuses in computing a parameter (e.g., an OPC correction, an illumination mode configuration, a dose profile, etc.) of a patterning process to at least partly correct for an optical aberration expected to occur in the patterning process. Using such techniques, for example, improved pattern fidelity may be realized compared to, for example, processes that do not account for optical aberration and/or obtain increased flexibility in the use of patterning devices when a process model accounts for a particular aberration of a projection system of a lithographic apparatus.

The use of average optical aberrations described herein can be used for various purposes including control of a process in the patterning process or an apparatus therein, monitoring of substrates produced by the patterning process, design of a process or apparatus of the patterning process, etc. For example, the results or another result derived therefrom can be used to alter an apparatus or process of the patterning process for the further processing of the substrate or for the processing of another substrate. For example, the results can be used to predict a defect. Prediction of a defect can be used, for example, to control a metrology tool to inspect the affected area and/or alter an apparatus or process of the patterning process for the further processing of the substrate or for the processing of another substrate. Further, the results can be used to design the patterning process by, e.g., deriving a dose recipe for correction of the lithographic apparatus, enabling design of the patterning device and its pattern, setup of a process, etc. The results can be used to determine one or more variables of a process (e.g., best exposure and/or best dose) which can then be used for various purposes. As will be appreciated, there can be many other uses.

In an embodiment, there is provided a method comprising: obtaining a process model of a patterning process that includes or accounts for an average optical aberration of optical systems of a plurality of apparatuses for use with a patterning process; and applying, by a hardware computer system, the process model to determine an adjustment to a parameter of the patterning process to account for the average optical aberration.

In an embodiment, the process model comprises an optical proximity correction model. In an embodiment, the determination of the adjustment to the parameter comprising determination of an optical proximity correction that compensates for the average optical aberration. In an embodiment, the average optical aberration is for a plurality of lithographic apparatuses and is specified at each of a plurality of locations of an exposure field. In an embodiment, the exposure field is a slit and the plurality of locations are spread along a length of the slit. In an embodiment, the average optical aberration is specified for a particular type of optical aberration. In an embodiment, the average optical aberration is specified in terms of each of a plurality of different types of optical aberration. In an embodiment, the average optical aberration(s) is defined in terms of a Zernike polynomial. In an embodiment, the method further comprises obtaining the average optical aberration of optical systems of the plurality of apparatuses for use with a patterning process; and generating the process model that includes the average optical aberration and that is configured to determine the adjustment to the parameter of the patterning process to account for the average optical aberration. In an embodiment, the method further comprises: obtaining optical aberrations of the optical system of each of the plurality of apparatuses, each optical aberration being obtained at a plurality of locations of an exposure field; and computing the average optical aberration of the plurality of apparatuses at each of the plurality of locations of the exposure field. In an embodiment, the method further comprises applying the adjustment of the parameter to the patterning process.

In an embodiment, there is provided a method comprising: obtaining an average optical aberration of optical systems of a plurality of apparatuses of a patterning process; and generating, by a hardware computer system, a process model that is configured to determine an adjustment to a parameter of the patterning process to account for the average optical aberration.

In an embodiment, the process model comprises an optical proximity correction model. In an embodiment, the determination of the adjustment to the parameter comprising determination of an optical proximity correction that compensates for the average optical aberration. In an embodiment, the average optical aberration is for a plurality of lithographic apparatuses and is specified at each of a plurality of locations of an exposure field. In an embodiment, the exposure field is a slit and the plurality of locations are spread along a length of the slit. In an embodiment, the average optical aberration is specified for a particular type of optical aberration. In an embodiment, the average optical aberration is specified in terms of each of a plurality of different types of optical aberration. In an embodiment, the average optical aberration(s) is defined in terms of a Zernike polynomial. In an embodiment, the method further comprises obtaining optical aberrations of the optical system of each of the plurality of apparatuses, each optical aberration being obtained at a plurality of locations of an exposure field; and computing the average optical aberration of the plurality of apparatuses at each of the plurality of locations of the exposure field. In an embodiment, the method further comprises using the process model to determine an adjustment to the parameter of the patterning process to account for the average optical aberration and applying the adjustment of the parameter to the patterning process.

In an embodiment, there is provided a method comprising: obtaining optical aberrations of an optical system of each of a plurality of lithographic apparatuses for use in a patterning process, each optical aberration being obtained at a plurality of locations of an exposure field of the lithographic apparatuses; and computing, by a hardware computer system, an average optical aberration of the plurality of lithographic apparatuses at each of the plurality of locations of the exposure field.

In an embodiment, the average optical aberration is specified for a particular type of optical aberration. In an embodiment, the average optical aberration is specified in terms of each of a plurality of different types of optical aberration. In an embodiment, the average optical aberration(s) is defined in terms of a Zernike polynomial. In an embodiment, the optical aberrations have variability within a certain limit. In an embodiment, the optical aberrations have variability within ±0.2 nm. In an embodiment, the exposure field is a slit and the plurality of locations is spread along a length of the slit. In an embodiment, the optical aberrations are defined in terms of a Zernike polynomial. In an embodiment, the method further comprises using the average optical aberration to determine an adjustment to a parameter of the patterning process to account for the average optical aberration and applying the adjustment of the parameter to the patterning process.

In an embodiment, there is provided a method comprising: determining an average optical aberration of the optical systems of a plurality of apparatuses for use in a patterning process; and generating, by a hardware computer system, an optical proximity model for adjusting a pattern to be imaged onto a substrate using the patterning process, wherein the optical proximity model is configured to apply optical proximity corrections to the pattern to at least partially compensate for the determined average optical aberration.

The embodiments may further be described using the following clauses:

1. A method comprising:
obtaining a process model of a patterning process that includes or accounts for an average optical aberration of optical systems of a plurality of apparatuses for use with a patterning process; and
applying, by a hardware computer system, the process model to determine an adjustment to a parameter of the patterning process to account for the average optical aberration.
2. The method of clause 1, wherein the process model comprises an optical proximity correction model.
3. The method of clause 1 or clause 2, wherein the determination of the adjustment to the parameter comprising determination of an optical proximity correction that compensates for the average optical aberration.
4. The method of any of clauses 1-3, wherein the average optical aberration is for a plurality of lithographic apparatuses and is specified at each of a plurality of locations of an exposure field.
5. The method according to clause 4, wherein the exposure field is a slit and the plurality of locations are spread along a length of the slit.
6. The method of any of clauses 1-5, wherein the average optical aberration is specified for a particular type of optical aberration.
7. The method of clause 6, wherein the average optical aberration is specified in terms of each of a plurality of different types of optical aberration.
8. The method of clause 6 or clause 7, wherein the average optical aberration(s) is defined in terms of a Zernike polynomial.
9. The method of any of clauses 1-8, further comprising:
obtaining the average optical aberration of optical systems of the plurality of apparatuses for use with a patterning process; and generating the process model that includes the average optical aberration and that is configured to determine the adjustment to the parameter of the patterning process to account for the average optical aberration.

10. The method of any of clauses 1-9, further comprising:
obtaining optical aberrations of the optical system of each of the plurality of apparatuses, each optical aberration being obtained at a plurality of locations of an exposure field; and
computing the average optical aberration of the plurality of apparatuses at each of the plurality of locations of the exposure field.

11. The method of any of clauses 1-10, further comprising applying the adjustment of the parameter to the patterning process.

12. A method comprising:
obtaining an average optical aberration of optical systems of a plurality of apparatuses of a patterning process; and
generating, by a hardware computer system, a process model that is configured to determine an adjustment to a parameter of the patterning process to account for the average optical aberration.

13. The method of clause 12, wherein the process model comprises an optical proximity correction model.

14. The method of clause 12 or clause 13, wherein the determination of the adjustment to the parameter comprising determination of an optical proximity correction that compensates for the average optical aberration.

15. The method of any of clauses 12-14, wherein the average optical aberration is for a plurality of lithographic apparatuses and is specified at each of a plurality of locations of an exposure field.

16. The method according to clause 15, wherein the exposure field is a slit and the plurality of locations are spread along a length of the slit.

17. The method of any of clauses 12-16, wherein the average optical aberration is specified for a particular type of optical aberration.

18. The method of clause 17, wherein the average optical aberration is specified in terms of each of a plurality of different types of optical aberration.

19. The method of clause 17 or clause 18, wherein the average optical aberration(s) is defined in terms of a Zernike polynomial.

20. The method of any of clauses 12-19, further comprising:
obtaining optical aberrations of the optical system of each of the plurality of apparatuses, each optical aberration being obtained at a plurality of locations of an exposure field; and
computing the average optical aberration of the plurality of apparatuses at each of the plurality of locations of the exposure field.

21. The method of any of clauses 12-20, further comprising using the process model to determine an adjustment to the parameter of the patterning process to account for the average optical aberration and applying the adjustment of the parameter to the patterning process.

22. A method comprising:
obtaining optical aberrations of an optical system of each of a plurality of lithographic apparatuses for use in a patterning process, each optical aberration being obtained at a plurality of locations of an exposure field of the lithographic apparatuses; and
computing, by a hardware computer system, an average optical aberration of the plurality of lithographic apparatuses at each of the plurality of locations of the exposure field.

23. The method of clause 22, wherein the average optical aberration is specified for a particular type of optical aberration.

24. The method of clause 22 or clause 23, wherein the average optical aberration is specified in terms of each of a plurality of different types of optical aberration.

25. The method of clause 23 or clause 24, wherein the average optical aberration(s) is defined in terms of a Zernike polynomial.

26. The method of any of clauses 22-25, wherein the optical aberrations have variability within a certain limit.

27. The method of clause 26, wherein the optical aberrations have variability within ±0.2 nm.

28. The method of any of clauses 22-27, wherein the exposure field is a slit and the plurality of locations is spread along a length of the slit.

29. The method of any of clauses 22-28, wherein the optical aberrations are defined in terms of a Zernike polynomial.

30. The method of any of clauses 22-29, further comprising using the average optical aberration to determine an adjustment to a parameter of the patterning process to account for the average optical aberration and applying the adjustment of the parameter to the patterning process.

31. A method comprising:
determining an average optical aberration of the optical systems of a plurality of apparatuses for use in a patterning process; and
generating, by a hardware computer system, an optical proximity model for adjusting a pattern to be imaged onto a substrate using the patterning process, wherein the optical proximity model is configured to apply optical proximity corrections to the pattern to at least partially compensate for the determined average optical aberration.

32. A method of adjusting a pattern to be imaged onto a substrate using the patterning process, the method comprising applying the model according to any of clauses 1-21 and 31.

33. A computer program product comprising a non-transitory computer readable medium having instructions recorded thereon, the instructions when executed by a computer implementing the method of any of clauses 1-32.

Figure 13:
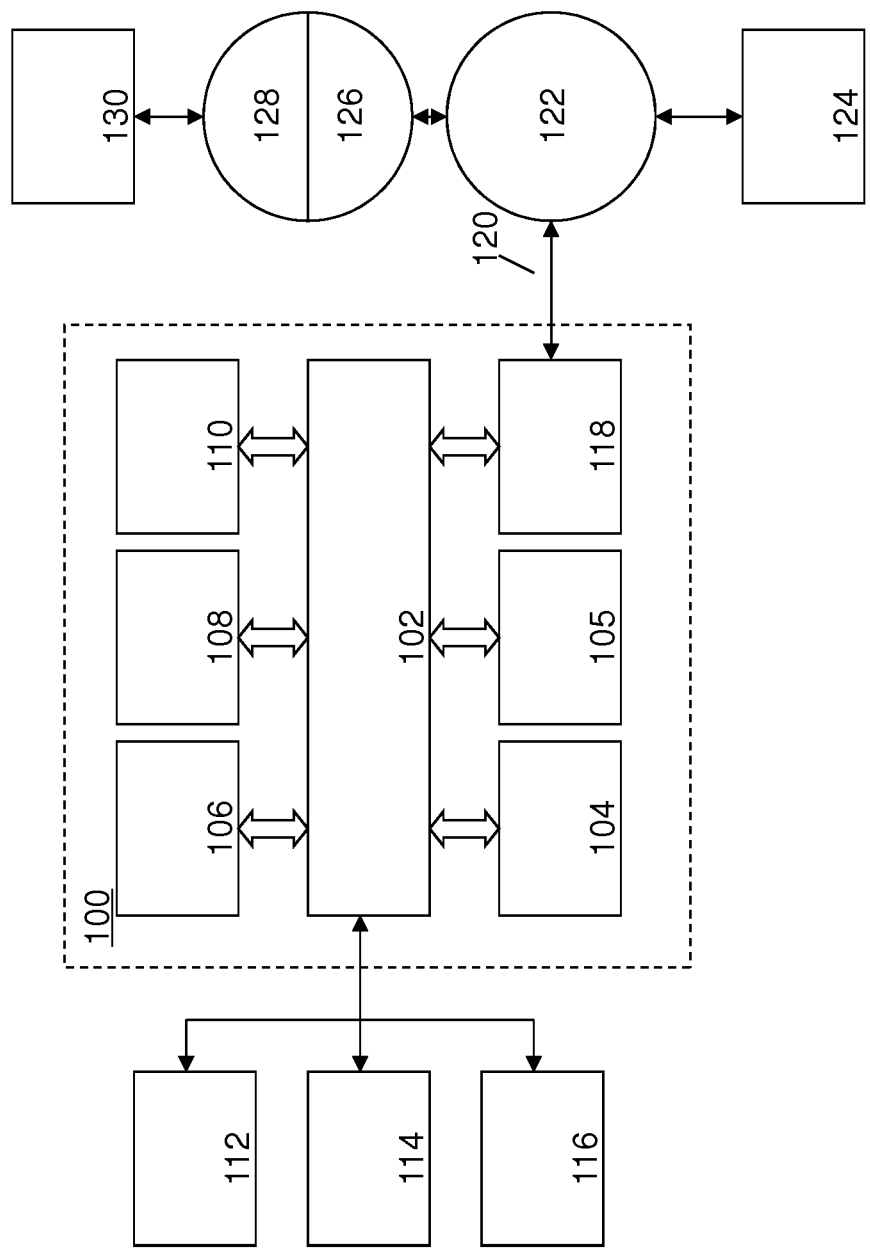
FIG. 13 is a block diagram of an example computer system in which embodiments can be implemented.

FIG. 13 is a block diagram that illustrates a computer system 100 which can assist in implementing the optimization methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of a process described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with one or more embodiments, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 14:
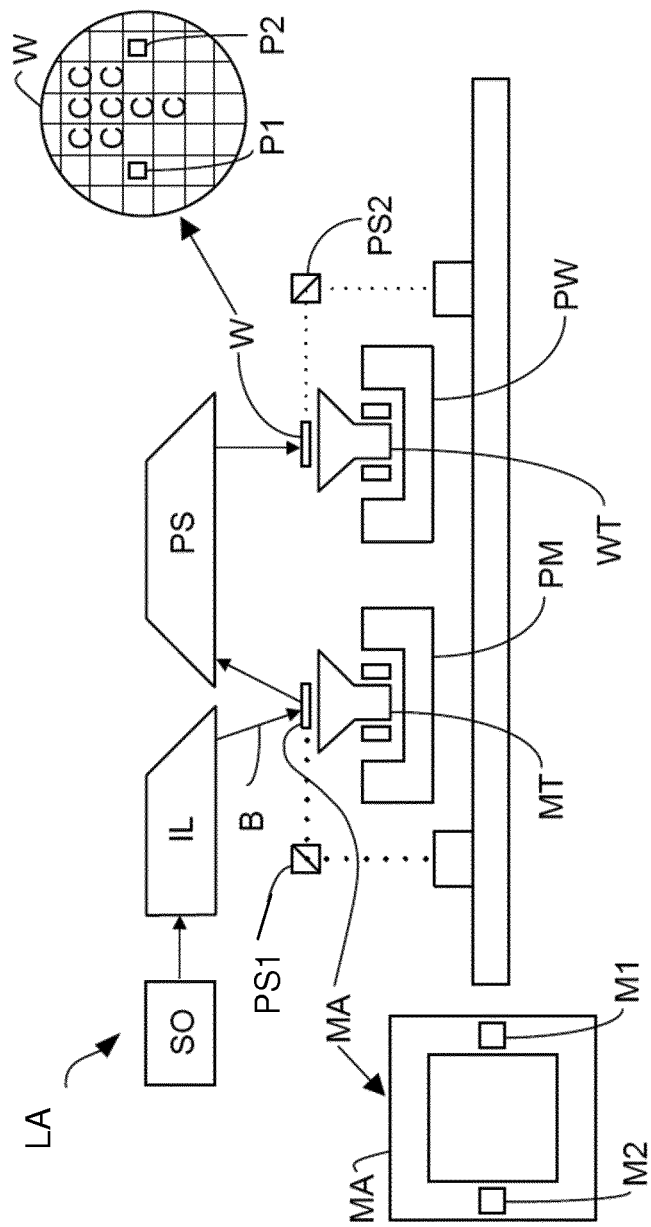
FIG. 14 is a schematic diagram of another lithographic projection apparatus.

FIG. 14 schematically depicts another exemplary lithographic projection apparatus LA that includes:

a source collector module SO to provide radiation.

an illumination system (illuminator) IL configured to condition a radiation beam B (e.g. EUV radiation) from the source collector module SO.

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

As here depicted, the apparatus LA is of a reflective type (e.g. employing a reflective mask). It is to be noted that because most materials are absorptive within the EUV wavelength range, the patterning device may have multi-layer reflectors comprising, for example, a multi-layer stack of molybdenum and silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 14, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 14, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the radiation source may be an integral part of the source collector module, for example when the radiation source is a discharge produced plasma EUV generator, often termed as a DPP radiation source.

The illuminator IL may comprise an adjuster for adjusting the angular intensity distribution of the radiation beam. Generally, at least the outer and/or inner radial extent (commonly referred to as G-outer and G-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LA could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 15:
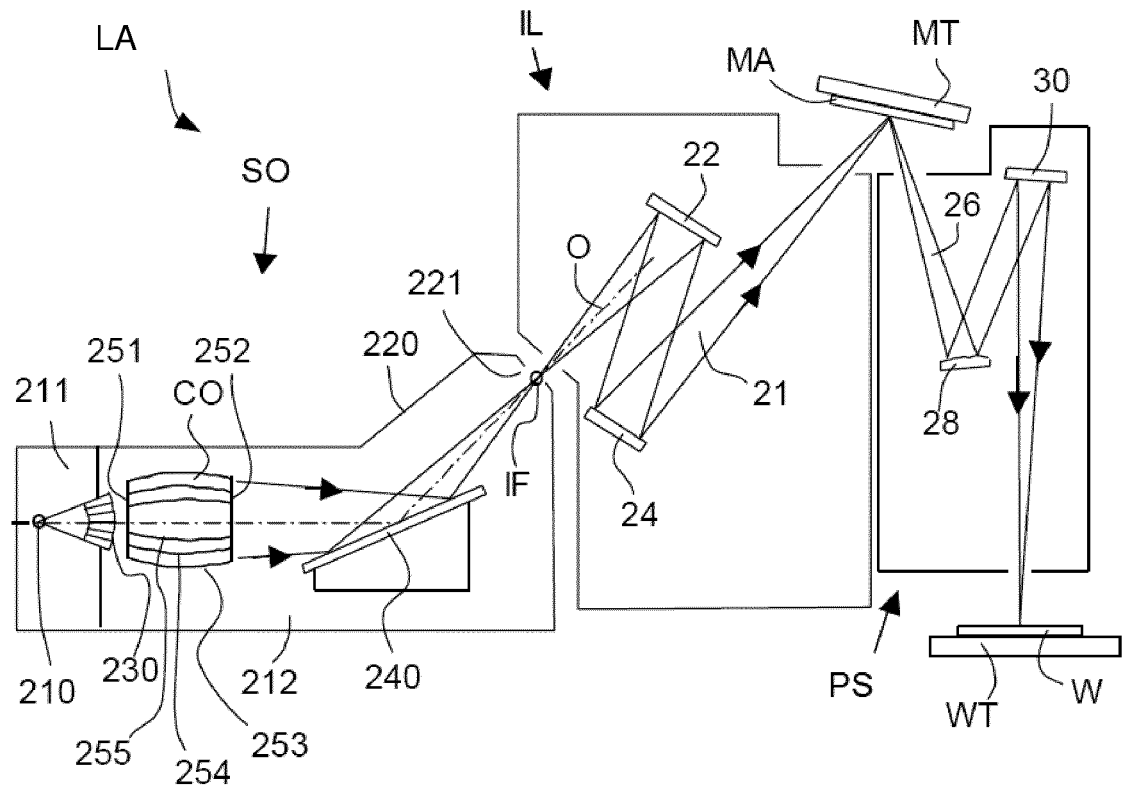
FIG. 15 is a more detailed view of the apparatus in FIG. 14.

FIG. 15 shows the apparatus LA in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma radiation source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line '0'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 15.

Collector optic CO, as illustrated in FIG. 15, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is desirably used in combination with a discharge produced plasma radiation source.

Figure 16:
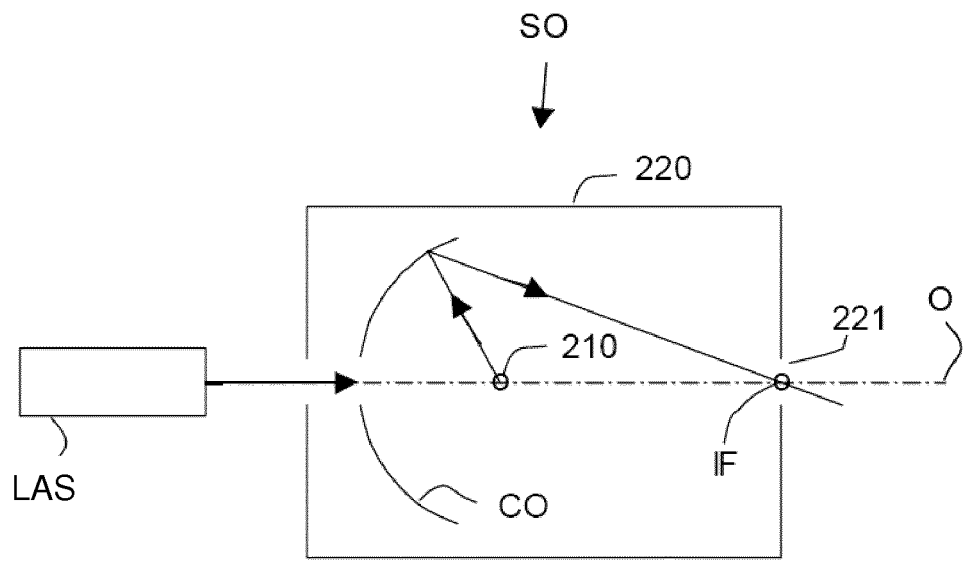
FIG. 16 is a more detailed view of the source collector module of the apparatus of FIG. 14 and FIG. 15.

Alternatively, the source collector module SO may be part of an LPP radiation system as shown in FIG. 16. A laser LAS is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although specific reference may be made in this text to the use of embodiments in the manufacture of ICs, it should be understood that the embodiments herein may have many other possible applications. For example, it may be employed in the manufacture of integrated optical systems, guidance and detection patterns for magnetic domain memories, liquid-crystal displays (LCDs), thin film magnetic heads, micromechanical systems (MEMs), etc. The skilled artisan will appreciate that, in the context of such alternative applications, any use of the terms "reticle", "wafer" or "die" herein may be considered as synonymous or interchangeable with the more general terms "patterning device", "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create, for example, a multi-layer IC, so that the term substrate used herein may also refer to a substrate that already contains multiple processed layers.

In the present document, the terms "radiation" and "beam" as used herein encompass all types of electromagnetic radiation, including ultraviolet radiation (e.g. with a wavelength of about 365, about 248, about 193, about 157 or about 126 nm) and extreme ultra-violet (EUV) radiation (e.g. having a wavelength in the range of 5-20 nm), as well as particle beams, such as ion beams or electron beams.

The terms "optimizing" and "optimization" as used herein refers to or means adjusting a patterning apparatus (e.g., a lithography apparatus), a patterning process, etc. such that results and/or processes have more desirable characteristics, such as higher accuracy of projection of a design pattern on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

Aspects of the invention can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the invention may be implemented using suitable apparatus which may specifically take the form of a programmable computer running a computer program arranged to implement a method as described herein. Thus, embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, these inventions have been grouped into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary sections of the present document should be taken as containing a comprehensive listing of all such inventions or all aspects of such inventions.

It should be understood that the description and the drawings are not intended to limit the present disclosure to the particular form disclosed, but to the contrary, the intention is to cover all modifications, equivalents, and alternatives falling within the spirit and scope of the inventions as defined by the appended claims.

Modifications and alternative embodiments of various aspects of the inventions will be apparent to those skilled in the art in view of this description. Accordingly, this description and the drawings are to be construed as illustrative only and are for the purpose of teaching those skilled in the art the general manner of carrying out the inventions. It is to be understood that the forms of the inventions shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every. References to selection from a range includes the end points of the range.

In the above description, any processes, descriptions or blocks in flowcharts should be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

While certain embodiments have been described, these embodiments have been presented by way of example only, and are not intended to limit the scope of the present disclosures. Indeed, the novel methods, apparatuses and systems described herein can be embodied in a variety of other forms; furthermore, various omissions, substitutions and changes in the form of the methods, apparatuses and systems described herein can be made without departing from the spirit of the present disclosures. The accompanying claims and their equivalents are intended to cover such forms or modifications as would fall within the scope and spirit of the present disclosures.

What is claimed is:

1. A method comprising:
obtaining a process model of a patterning process that includes or accounts for an average optical aberration of optical systems of a plurality of apparatuses for use with a patterning process; and
applying, by a hardware computer system, the process model to determine an adjustment to a parameter of the patterning process to account for the average optical aberration.

2. The method of claim 1, wherein the process model comprises an optical proximity correction model.

3. The method of claim 1, wherein the determination of the adjustment to the parameter comprises determination of an optical proximity correction that compensates at least partially for the average optical aberration.

4. The method of claim 1, wherein the average optical aberration is for a plurality of lithographic apparatuses and is specified at each of a plurality of locations of an exposure field.

5. The method of claim 4, wherein the exposure field is a slit and the plurality of locations are spread along a length of the slit.

6. The method of claim 1, wherein the average optical aberration is specified for a particular type of optical aberration.

7. The method of claim 6, wherein the average optical aberration is specified in terms of each of a plurality of different types of optical aberration.

8. The method of claim 6, wherein the average optical aberration(s) is defined in terms of a Zernike polynomial.

9. The method of claim 1, further comprising:
obtaining the average optical aberration of optical systems of the plurality of apparatuses for use with a patterning process; and
generating the process model that includes the average optical aberration and that is configured to determine the adjustment to the parameter of the patterning process to account for the average optical aberration.

10. The method of claim 1, further comprising:
obtaining optical aberrations of the optical system of each of the plurality of apparatuses, each optical aberration being obtained at a plurality of locations of an exposure field; and
computing the average optical aberration of the plurality of apparatuses at each of the plurality of locations of the exposure field.

11. The method of claim 10, wherein the optical aberrations have variability within a certain limit.

12. The method of claim 10, wherein the optical aberrations have variability within ±0.2 nm.

13. The method of claim 1, further comprising applying the adjustment of the parameter to the patterning process.

14. A method of adjusting a pattern to be imaged onto a substrate using the patterning process, the method comprising applying the model claim 1.

15. A computer program product comprising a non-transitory computer readable medium having instructions therein, the instructions, upon execution by a computer system, configured to cause the computer system to at least:
obtain a process model of a patterning process that includes or accounts for an average optical aberration of optical systems of a plurality of apparatuses for use with a patterning process; and
apply the process model to determine an adjustment to a parameter of the patterning process to account for the average optical aberration.

16. A method comprising:
obtaining an average optical aberration of optical systems of a plurality of apparatuses of a patterning process; and
generating, by a hardware computer system, a process model that is configured to determine an adjustment to a parameter of the patterning process to account for the average optical aberration.

17. The method of claim 16, wherein the process model comprises an optical proximity correction model.

18. A computer program product comprising a non-transitory computer readable medium having instructions therein, the instructions, upon execution by a computer system, configured to cause the computer system to at least:
obtain an average optical aberration of optical systems of a plurality of apparatuses of a patterning process; and
generate a process model that is configured to determine an adjustment to a parameter of the patterning process to account for the average optical aberration.

19. A method comprising:
determining an average optical aberration of the optical systems of a plurality of apparatuses for use in a patterning process; and
generating, by a hardware computer system, an optical proximity model for adjusting a pattern to be imaged onto a substrate using the patterning process, wherein the optical proximity model is configured to apply optical proximity corrections to the pattern to at least partially compensate for the determined average optical aberration.

20. A computer program product comprising a non-transitory computer readable medium having instructions therein, the instructions, upon execution by a computer system, configured to cause the computer system to at least:
determine an average optical aberration of the optical systems of a plurality of apparatuses for use in a patterning process; and
generate an optical proximity model for adjusting a pattern to be imaged onto a substrate using the patterning process, wherein the optical proximity model is configured to apply optical proximity corrections to the pattern to at least partially compensate for the determined average optical aberration.

* * * * *